US007736749B2

(12) United States Patent
Baba et al.

(10) Patent No.: US 7,736,749 B2
(45) **Date of Patent: *Jun. 15, 2010**

(54) THERMOSETTING RESIN COMPOSITION, RESIN FILM, METALLIC FOIL PROVIDED WITH AN INSULATION MATERIAL, INSULATION FILM PROVIDED WITH A METALLIC FOIL ON EACH SIDE, METAL-CLAD LAMINATE, MULTI-LAYERED METAL-CLAD LAMINATE, AND MULTI-LAYERED PRINTED WIRING BOARD

(75) Inventors: Hideo Baba, Tochigi (JP); Nozomu Takano, Ibaraki (JP); Kazuhiro Miyauchi, Ibaraki (JP)

(73) Assignee: Hitachi Chemichal Co., Ltd., Tokyo (JP)

(*) Notice: Subject to any disclaimer, the term of this patent is extended or adjusted under 35 U.S.C. 154(b) by 0 days.

This patent is subject to a terminal disclaimer.

(21) Appl. No.: 11/537,122

(22) Filed: Sep. 29, 2006

(65) Prior Publication Data

US 2007/0037950 A1 Feb. 15, 2007

Related U.S. Application Data

(62) Division of application No. 10/239,189, filed as application No. PCT/JP01/02660 on Mar. 29, 2001, now Pat. No. 7,166,361.

(30) Foreign Application Priority Data

| | | |
|---|---|---|
| Mar. 31, 2000 | (JP) | P2000-101228 |
| Aug. 11, 2000 | (JP) | P2000-244573 |
| Dec. 28, 2000 | (JP) | P2000-399796 |

(51) Int. Cl.

| | |
|---|---|
| ***B32B 15/08*** | (2006.01) |
| ***C08L 83/04*** | (2006.01) |
| ***C08L 83/05*** | (2006.01) |
| ***C08L 83/06*** | (2006.01) |
| ***C08L 83/07*** | (2006.01) |
| ***C08K 3/00*** | (2006.01) |

(52) U.S. Cl. ....................... 428/450; 428/447; 428/448; 428/901; 525/474; 524/588

(58) Field of Classification Search ....................... None
See application file for complete search history.

(56) References Cited

U.S. PATENT DOCUMENTS

| | | | | |
|---|---|---|---|---|
| 3,825,618 | A | 7/1974 | Pepe | |
| 4,584,342 | A | 4/1986 | Kondow | |
| 4,652,618 | A | 3/1987 | Sumida et al. | |
| 4,694,040 | A | 9/1987 | Hashimoto et al. | |
| 4,778,860 | A | 10/1988 | Morita et al. | |
| 4,954,580 | A * | 9/1990 | Zahir | 525/476 |
| 5,002,637 | A | 3/1991 | Toyoshima et al. | |
| 5,173,359 | A | 12/1992 | Toyoshima et al. | |
| 5,182,173 | A | 1/1993 | Swi | |
| 5,432,218 | A | 7/1995 | Mikami et al. | |
| 5,438,094 | A | 8/1995 | Fujiki et al. | |
| 5,446,088 | A | 8/1995 | Haluska | |
| 5,540,948 | A | 7/1996 | Haluska | |
| 5,856,016 | A | 1/1999 | Takahashi et al. | |
| 5,939,472 | A | 8/1999 | Ito et al. | |
| 5,952,044 | A | 9/1999 | Deichmann et al. | |
| 5,967,906 | A | 10/1999 | Horiuchi et al. | |
| RE36,396 | E | 11/1999 | Arthur et al. | |
| 6,017,389 | A | 1/2000 | Schmidt et al. | |
| 6,100,408 | A | 8/2000 | Monkiewicz et al. | |
| 6,103,836 | A * | 8/2000 | Imashiro et al. | 525/452 |
| 6,107,418 | A | 8/2000 | Mueller | |
| 6,197,149 | B1 * | 3/2001 | Kobayashi et al. | 156/305 |
| 6,376,923 | B1 * | 4/2002 | Sumita et al. | 257/791 |
| 6,534,187 | B2 | 3/2003 | Kron et al. | |
| 6,696,155 | B1 | 2/2004 | Takano et al. | |
| 7,166,361 | B2 * | 1/2007 | Baba et al. | 428/447 |

FOREIGN PATENT DOCUMENTS

| | | |
|---|---|---|
| DE | 4303570 | 8/1993 |
| DE | 198 05 083 | 8/1999 |
| EP | 0625532 | 11/1994 |

(Continued)

OTHER PUBLICATIONS

English Language Abstract of JP 63-017927.

(Continued)

*Primary Examiner*—Michael J Feely
(74) *Attorney, Agent, or Firm*—Greenblum & Bernstein, P.L.C.

(57) ABSTRACT

A process for producing a silicone polymer comprising a step of subjecting, to hydrolysis and polycondensation reaction, a silane compound mixture containing 35 to 100% by mol of a silane compound represented by the general formula (I):

$$R'_m(H)_kSiX_{4-(m+k)} \quad (I)$$

(wherein X is a hydrolysable and polycondensable group, e.g., a halogen atom (e.g., chlorine or bromine) or —OR; R is an alkyl group of 1 to 4 carbon atoms or an alkyl carbonyl group of 1 to 4 carbon atoms; R' is a non-reactive group, e.g., an alkyl group of 1 to 4 carbon atoms or an aryl group (e.g., a phenyl group); "k" is 1 or 2; "m" is 0 or 1; and "m+k" is 1 or 2), and further subjecting the resultant product to hydrosilylation reaction with a hydrosilylation agent.

40 Claims, No Drawings

FOREIGN PATENT DOCUMENTS

| | | |
|---|---|---|
| JP | 59-027945 | 2/1984 |
| JP | 61-275331 | 12/1986 |
| JP | 62-040368 | 8/1987 |
| JP | 63-017927 | 1/1988 |
| JP | 63-230729 | 9/1988 |
| JP | 1-204953 | 8/1989 |
| JP | 3-062845 | 3/1991 |
| JP | 3-287869 | 12/1991 |
| JP | 5-259228 | 10/1993 |
| JP | 6-021593 | 1/1994 |
| JP | 8-311159 | 11/1996 |
| JP | 9-142825 | 6/1997 |
| JP | 9-201529 | 8/1997 |
| JP | 9-202612 | 8/1997 |
| JP | 10-121363 | 5/1998 |
| JP | 11-060951 | 3/1999 |
| JP | 11-106530 | 4/1999 |
| JP | 11-335527 | 12/1999 |
| WO | 97/01595 | 1/1997 |

OTHER PUBLICATIONS

English language abstract of JP 9-201529.
English language abstract of JP 9-142825.
English language abstract of JP 9-202612.
English language abstract of JP 8-311159.
English language abstract of JP 11-335527.
English language abstract of JP 6-21593.
English language abstract of JP 63-230729.
English language abstract of JP 59-27945.
English language abstract of JP 3-62845.
English language abstract of JP 3-287869.
English language abstract of JP 1-204953.
English language abstract of JP 10-121363.
English language abstract of JP 11-60951.
English language abstract of JP 11-106530.
English language abstract of DE 198 05 083, published Aug. 12, 1999.
English language abstract of JP 61-275331.
English language of IPER for International Application PCT/JP01/02660.
English language abstract of JP 5-259228.

* cited by examiner

THERMOSETTING RESIN COMPOSITION, RESIN FILM, METALLIC FOIL PROVIDED WITH AN INSULATION MATERIAL, INSULATION FILM PROVIDED WITH A METALLIC FOIL ON EACH SIDE, METAL-CLAD LAMINATE, MULTI-LAYERED METAL-CLAD LAMINATE, AND MULTI-LAYERED PRINTED WIRING BOARD

CROSS-REFERENCE TO RELATED APPLICATIONS

This application is a divisional of application Ser. No. 10/239,189 filed Jan. 22, 2003 (now U.S. Pat. No. 7,166,361), which is a National Stage Application of International Application No. PCT/JP01/02660, filed Mar. 29, 2001, and which claims priority to Japanese Application Nos.: 2000-101228, filed Mar. 31, 2000; 2000-244573, filed Aug. 11, 2000; and 2000-399796, filed Dec. 28, 2000. The entire disclosure of parent application Ser. No. 10/239,189 is expressly incorporated by reference herein in its entirety.

TECHNICAL FIELD

The present invention relates to a process for producing a novel silicone polymer, a silicone polymer produced by the same process, a thermosetting resin composition, a resin film, a metallic foil provided with an insulation material, an insulation film provided with a double-sided metallic foil, a metal-clad laminate, a multi-layered metal-clad laminate, and a multi-layered printed-wiring board

BACKGROUND ART

Personal computers and cellular phones have been rapidly spreading, and the printed-wiring boards for these devices are required to be more dense. Under these circumstances, printed-wiring boards and metal-clad laminates are required to be more reliable. Properties particularly required to be improved include heat resistance, low moisture-absorptivity and low stress which directly affect their resistance to reflow, and low thermal expansion which directly affects the connection reliability between their layers and between them and others with which they are assembled.

So far, inorganic materials have been used to realize excellent heat resistance, low moisture-absorptivity and low thermal expansion, and methods of developing composites of organic and inorganic materials have been studied to bring out the advantages of each material. One of these methods uses surface treatment agents, e.g., a silane coupling agent. A silane coupling agent has a structure with an organic functional group bonded to a hydrolyzable alkoxy group. It is known that the agent of such structure works to enhance adhesion between an inorganic material and an organic polymer, because the alkoxy group reacts with an inorganic material surface and an organic functional group with an organic polymer to bond the inorganic and organic components to each other.

Each industrial area has been utilizing and applying characteristics of enhancing adhesion between an inorganic and organic materials, and studying to further improve adhesion between these materials at their interface. For example, Japanese Patent Laid-open Publication No. 63-230729 and Japanese Patent Publication No. 62-40368 disclose methods of improving adhesion between an inorganic and organic material at their interface, where types and number of the organic functional groups which a common silane coupling agent includes are controlled in order to enhance its reactivity with an organic polymer. However, merely enhancing reactivity with an organic polymer only gives a rigid layer, and cannot be expected to notably improve adhesion, because of the difficulty in reducing residual stress or the like produced in the interface.

One of the methods for improving adhesion and also decreasing residual stress in the interface uses a long-chain polysiloxane for reducing stress in combination with a surface treatment agent (Japanese Patent Laid-open Publication Nos. 3-62845 and 3-287869). It is however very difficult for such an approach to obtain high adhesion in the interface for several reasons, e.g., very low reactivity between a surface treatment agent and long-chain polysiloxane under common treatment conditions, a common long-chain polysiloxane lacking an alkoxy group reactive with an inorganic material, and adverse effect by hydrophobicity of a methyl group or the like in a long-chain polysiloxane.

On the other hand, Japanese Patent Laid-open Publication No. 1-204953 discloses a method which uses a chain-structured polysiloxane having both an alkoxyl group and an organic functional group, the former being reactive with an inorganic material and the latter with an organic polymer. However, the polysiloxane chain in such a compound, when sufficiently long, would lie across the inorganic material surface, due to the orientation of the hydrophobic group, e.g., methyl, and does not easily enter the resin. Moreover, it will be physically adsorbed by the inorganic material in places, tending to form a rigid layer. Therefore, it is very difficult for such a compound to realize the reduced stress in the interface to the extent expected from its chain length.

A long-chain polysiloxane tends to be physically adsorbed to form a large cyclic structure, which can possibly deteriorate the properties of the organic polymer after it has been set. It is known that the above problems are effectively solved in a prepreg comprising a base of glass or the like by use, as a dispersant or base surface treatment agent, of a silicone polymer three-dimensionally condensed beforehand to have at least one functional group reactive with a hydroxyl group on the inorganic material surface and at least one organic functional group reactive with the organic polymer (Japanese Patent Laid-open Publication Nos. 10-121363, 11-60951 and 11-106530).

Under these circumstances, novel materials, such as a resin composition formable into a film and having by itself excellent properties of low stress and low thermal expansion irrespective of the base material on which it is placed, and a resin film of such a composition, have been demanded to correspond to requirements for wiring of higher density for semiconductor-carrying bases.

DISCLOSURE OF THE INVENTION

It is an object of the present invention to provide a novel material having advantages of inorganic and organic material, which can include a high proportion of an inorganic component to realize excellent heat resistance and low moisture-absorptivity, and, at the same time, has excellent properties of low stress and low thermal expansion.

The present invention provides a novel silicone polymer excellent in reactivity with inorganic material, having a capacity to disperse an inorganic material and reactivity with organic material, which are difficult to realize by the conventional approach of using a silane coupling agent, long-chain-polysiloxane or the like alone, and also having capacity for being formed into a film.

The present invention also provides a novel resin composition having excellent properties of low stress and low thermal expansion, and resin film, metallic foil provided with an insulating material and metal-clad laminate which use the above resin composition to realize high reliability.

The present invention also provides a novel resin composition high in content of an inorganic filler in the whole resin and high in elongation, and a resin film, a metallic foil provided with an insulating material and a metal-clad laminate which use the above resin composition to realize high reliability.

The present invention also provides a novel resin composition having excellent properties of low thermal expansion and high breaking stress, and a resin film, a metallic foil provided with an insulating material and a metal-clad laminate which use the above resin composition to realize high reliability.

The present invention also provides a novel resin composition high in content of an inorganic filler in the whose resin and having high breaking stress, and a resin film, a metallic foil provided with an insulating material and a metal-clad laminate which use the above resin composition to realize high reliability.

The present invention also provides a novel resin composition having excellent properties of low thermal expansion and sufficient adhesion, and resin film, metallic foil provided with an insulating material and metal-clad laminate which use the above resin composition to realize high reliability.

The present invention also provides a novel resin composition high in content of an inorganic filler in the whole resin and sufficient adhesion, and resin film, metallic foil provided with an insulating material and metal-clad laminate which use the above resin composition to realize high reliability.

The present invention is directed to the following 59 aspects (1) to (59):

(1) A process for producing a silicone polymer comprising a step of subjecting, to hydrolysis and polycondensation reaction, a silane compound mixture containing 35 to 100% by mol of a silane compound represented by the general formula (I):

$$R'_m(H)_kSiX_{4-(m+k)} \qquad (I)$$

(wherein X is a hydrolysable and polycondensable group, e.g., a halogen atom (e.g., chlorine or bromine) or —OR; R is an alkyl group of 1 to 4 carbon atoms or an alkyl carbonyl group of 1 to 4 carbon atoms; R' is a non-reactive group, e.g., an alkyl group of 1 to 4 carbon atoms or an aryl group (e.g., a phenyl group); "k" is 1 or 2, "m" is 0 or 1; and "m+k" is 1 or 2) and 65 to 0% by mol of a silane compound represented by the general formula (II):

$$R'_nSiX_{4-n} \qquad (II)$$

(wherein X is a hydrolysable and a polycondensable group, e.g., a halogen atom (e.g., chlorine or bromine) or —OR; R is an alkyl group of 1 to 4 carbon atoms or an alkyl carbonyl group of 1 to 4 carbon atoms; R' is a non-reactive group, e.g., an alkyl group of 1 to 4 carbon atoms or an aryl group (e.g., a phenyl group); and "n" is an integer of 0 to 2), and further subjecting the resultant product to hydrosilylation reaction with a hydrosilylation agent.

(2) The process for producing a silicone polymer according to the aspect (1), wherein the total amount of said silane compound represented by the general formula (I) in which "m+k" is 1 and said silane compound represented by the general formula (II) in which "n" is 1 or less is in a range of 3 to 100% by mol with respect to the total silane compounds.

(3) The process for producing a silicone polymer according to the aspect (1) or (2), wherein said hydrosilylation agent is a compound having a double bond and another functional group.

(4) The process for producing a silicone polymer according to the aspect (3), wherein the functional group other than the double bond in the hydrosilylation agent is an epoxy or an amino group.

(5) A silicone polymer produced by the process according to one of the aspects (1) to (4).

(6) A thermosetting resin composition containing the silicone polymer according to the aspect (5), a setting agent at 0.2 to 1.5 equivalents per equivalent of the resin-setting functional group in the silicone polymer, and an inorganic filler at 100 to 2,000 parts by weight with respect to 100 parts by weight of the silicone polymer.

(7) The thermosetting resin composition according to the aspect (6) which further contains an elastomer modified with a silyl group at both terminals at 0.1 to 30 parts by weight with respect to 100 parts by weight of the silicone polymer.

(8) The thermosetting resin composition according to the aspect (6) or (7) which further contains an amine compound having a plurality of reactive groups at 0.01 to 9 parts by weight with respect to 100 parts by weight of the silicone polymer.

(9) A thermosetting resin composition containing the silicone polymer according to the aspect (5) and an epoxy-modified silicone oil in a former/latter ratio of 100/0 to 0.1/99.9 by weight, a setting agent at 0.2 to 1.5 equivalents per equivalent of the resin-setting functional group in the silicone polymer and epoxy-modified silicone oil, and an inorganic filler at 100 to 2,000 parts by weight with respect to 100 parts by weight of the silicone polymer and epoxy-modified silicone oil.

(10) A thermosetting resin composition containing a silicone polymer having a non-resin setting functional silicone polymer and an epoxy-modified silicone oil in a former/latter ratio of 100/0 to 0.1/99.9 by weight, a setting agent at 0.2 to 1.5 equivalents per equivalent of the epoxy group in the epoxy-modified silicone oil, and an inorganic filler at 100 to 2,000 parts by weight with respect to 100 parts by weight of the silicone polymer and epoxy-modified silicone oil.

(11) The thermosetting resin composition according to the aspect (9) or (10) which further contains an elastomer modified with a silyl group at both terminals at 0.1 to 30 parts by weight with respect to 100 parts by weight of the silicone polymer according to the aspect (5) and epoxy-modified silicone oil.

(12) The thermosetting resin composition according to one of the aspects (9) to (11) which further contains an amine compound having a plurality of reactive groups at 0.01 to 9 parts by weight with respect to 100 parts by weight of the silicone polymer according to the aspect (5) and epoxy-modified silicone oil.

(13) The thermosetting resin composition according to one of the aspects (9) to (12), wherein the setting agent comprises an amine compound and is incorporated excessively comparing to the resin-setting functional group.

(14) The thermosetting resin composition according to one of the aspects (9) to (13), wherein the setting agent comprises a phenol-based setting agent.

(15) The thermosetting resin composition according to one of the aspects (93 to (14), wherein the setting agent comprises a phenol-based setting agent and amine compound.

(16) A thermosetting resin composition having a thermal expansion coefficient of $30\times10^{-6}/°$ C. or less after it has been set.

(17) A thermosetting resin composition having a thermal expansion coefficient of $15\times10^{-6}/°$ C. or less after it has been set.

(18) A thermosetting resin composition having a thermal expansion coefficient of $50\times10^{-6}/°$ C. or less after it has been set and an elongation of 1.0% or more as determined by a tensile test after it has been set.

(19) A thermosetting resin composition having a thermal expansion coefficient of $50\times10^{-6}/°$ C. or less after it has been set and a breaking stress of 2 MPa or more after it has been set.

(20) The thermosetting resin composition according to the aspect (19) which has an elongation of 1.0% or more as determined by a tensile test after it has been set.

(21) A thermosetting resin composition having a thermal expansion coefficient of $50\times10^{-6}/°$ C. or less after it has been set, and a peel strength of 0.5 kN/m or more after it has been set with an electroconductive layer to which it is bonded.

(22) The thermosetting resin composition according to the aspect (21) which has an elongation of 1.0% or more as determined by a tensile test after it has been set.

(23) The thermosetting resin composition according to the aspect (21) or (22) which has a breaking stress of 2 MPa or more after it has been set.

(24) The thermosetting resin composition according to one of the aspects (16) to (23) which contains an inorganic filler.

(25) The thermosetting resin composition according to the aspect (24) which contains: the thermosetting resin according to the aspect (5); a setting agent; and an inorganic filler as the essential components, wherein the inorganic filler is incorporated at 100 parts by weight or more with respect to 100 parts by weight of the thermosetting resin.

(26) The thermosetting resin composition according to the aspect (24) or (25) which contains the setting agent at 0.2 to 1.5 equivalents per equivalent of the resins-setting functional group in the thermosetting resin.

(27) The thermosetting resin composition according to one of the aspects (24) to (26) which contains the inorganic filler at 100 to 2,000 parts by weight with respect to 100 parts by weight of the thermosetting resin.

(28) The thermosetting resin composition according to one of the aspects (24) to (27) which contains the silicone polymer according to the aspect (5) as the thermosetting resin.

(29) A thermosetting resin composition containing a thermosetting resin, a setting agent and an inorganic filler as the essential components, wherein the inorganic filler is incorporated at 100 parts by weight or more with respect to 100 parts by weight of the thermosetting resin, and the composition has an elongation of 1.0% or more as determined by a tensile test after it has been set.

(30) A thermosetting resin composition containing a thermosetting resin, a setting agent and an inorganic filler as the essential components, wherein the inorganic filler is incorporated at 100 parts by weight or more with respect to 100 parts by weight of the thermo setting resin, and the composition has a breaking stress of 2 MPa or more after it has been set.

(31) The thermosetting resin composition according to the aspect (30) which has an elongation of 1.0% or more as determined by a tensile test after it has been set.

(32) The thermosetting resin composition according to the aspect (30) or (31) which contains an elastomer modified with a silyl group at both terminals.

(33) The thermosetting resin composition according to one of the aspects (30) to (32) which contains the silicone polymer according to the aspect (5) as the thermosetting resin and an epoxy-modified silicone oil.

(34) The thermosetting resin composition according to one of the aspects (30) to (33) which contains, as the thermosetting resin, a mixture of an epoxy-modified silicone oil and a silicone polymer having a non-resin setting function.

(35) The thermosetting resin composition according to one of the aspects (30) to (34) which contains a mixture of an epoxy-modified silicone oil and a silicone polymer having a non-resin setting function, wherein the silicone polymer is incorporated at 0.1 to 10 parts by weight with respect to 100 parts by weight of the mixture.

(36) A thermosetting resin composition containing an inorganic filler at 100 parts by weight or more with respect to 100 parts by weight of the thermosetting resin and having a peel strength of 0.25 kN/m or more after it has been set with an electroconductive layer to which it is bonded.

(37) A thermosetting resin composition containing an inorganic filler at 100 parts by weight or more with respect to 100 parts by weight of the thermosetting resin and having a peel strength of 0.5 kN/m or more after it has been set with an electroconductive layer to which it is bonded.

(38) The thermosetting resin composition according to the aspect (36) or (37) which has an elongation of 1.0% or more as determined by a tensile test after it has been set.

(39) The thermosetting resin composition according to one of the aspects (36) to (38) which has a breaking stress of 2 MPa or more after it has been set.

(40) The thermosetting resin composition according to one of the aspects (36) to (39) which contains an amine compound having a plurality of reactive groups.

(41) The thermosetting resin composition according to one of the aspects (29) to (40) which contains an inorganic filler at 800 parts by weight or more with respect to 100 parts by weight of the thermosetting resin.

(42) The thermosetting resin composition according to the aspect (41) which contains the setting agent at 0.2 to 1.5 equivalents per equivalent of the resin-setting functional group in the thermosetting resin.

(43) The thermosetting resin composition according to the aspect (41) or (42) which contains the silicone polymer according to the aspect (5) as the thermosetting resin.

(44) The thermosetting resin composition according to one of the aspects (41) to (43) which has a thermal expansion coefficient of $50\times10^{-6}/°$ C. or less after it has been set.

(45) A thermosetting resin composition containing a thermosetting resin, a setting agent and an inorganic filler as the essential components, wherein content F of the inorganic filler (parts by weight with respect to 100 parts of the thermosetting resin) and elongation X (%) of the composition determined by the tensile test after it has been set satisfy the relationship $F\times X>800$.

(46) The thermosetting resin composition according to the aspect (45) which has a thermal expansion coefficient of $50\times10^{-6}/°$ C. or less after it has been set.

(47) The thermosetting resin composition according to the aspect (45) or (46) which has an elongation of 1.0% or more as determined by a tensile test after it has been set.

(48) The thermosetting resin composition according to one of the aspects (45) to (47) which contains the setting agent at 0.2 to 1.5 equivalents per equivalent of the resin-setting functional group in the thermosetting resin.

(49) The thermosetting resin composition according to one of the aspects (45) to (48) which contains the inorganic filler at 100 to 2,000 parts by weight with respect to 100 parts by weight of the thermosetting resin.

(50) The thermosetting resin composition according to one of the aspects (45) to (49) which contains the silicone polymer according to the aspect (5) as the thermosetting resin.

(51) A resin film produced by use of the thermosetting resin composition according to one of the aspects (6) to (50).

(52) A metallic foil provided with an insulation material, comprising a layer of the thermosetting resin composition according to one of the aspects (6) to (50) being placed on one side of the metallic foil.

(53) An insulation film provided with a double sided metallic foil, wherein a layer composed of the thermosetting resin composition according to one of the aspects (6) to (50) is coated with a double sided copper foil.

(54) An insulation film provided with a double sided metallic foil, wherein 2 sheets of the metallic foil provided with an insulation material according to the aspect (52) are placed one on another into a monolithic structure in such a way that the layers of the thermosetting resin composition come into contact with each other.

(55) A metal-clad laminate comprising a core material coated with an insulation resin layer on one or both sides, the insulation resin layer being coated with a metallic layer, wherein the insulation resin layer is of the thermosetting resin composition according to one of the aspects (6) to (50).

(56) The metal-clad laminate according to the aspect (55), wherein the metallic layer is of copper.

(57) A multi-layered metal-clad laminate provided with a resin layer of the thermosetting resin composition according to one of the aspects (6) to (50) on a circuit of an internal circuit board, the resin layer being coated with a metallic layer.

(58) The multi-layered metal-clad laminate according to the aspect (57), wherein the metallic layer is of copper.

(59) A multi-layered printed-wiring board having a resin layer of the thermosetting resin composition according to one of the aspects (6) to (50) on a circuit on an internal circuit board, the resin layer being provided with a circuit pattern.

The novel silicone compound of the present invention well disperses an inorganic filler therein. Use of the silicone compound also allows the inorganic filler to be dispersed in a resin composition to a higher proportion, and gives a resin film and resin layer low in thermal expansion coefficient after it has been set and high in elongation determined by a tensile test after it has been set.

The thermosetting resin composition of the present invention, for its low stress and low thermal expansion coefficient, can give a material of low stress and low thermal expansion coefficient which is difficult to produce by the conventional process. Moreover, it can give a set product, e.g., film, which is excellent both in handleability and low thermal expansion coefficient. It can also give a material with a low thermal expansion coefficient and, at the same time, sufficient adhesion. Therefore, the present invention can provide a resin film, metallic foil provided with an insulation material and metal-clad laminate of high reliability. Still more, the resin film or resin layer of the thermosetting resin composition of the low stress and low thermal expansion coefficient exhibits excellent characteristics as an insulation material. Therefore, it can be used as an insulation layer or the like provided with a function of stress relaxation, suitable for a chip-carrying board.

The present invention has been filed in claiming the priorities from Japanese Patent laid-open Publication Nos. 2000-101228 (filed on Mar. 31, 2000), 2000-244573 (filed on Aug. 11, 2000) and 2000-399796 (filed on Dec. 28, 2000) which the inventors of the present invention have filed. The specifications of these inventions are incorporated in this specification by reference.

BEST MODE FOR CARRYING OUT THE INVENTION

The resin-settable silicone polymer of the present invention can be produced by reacting a silane compound represented by the general formula (I) with a hydrosilylation agent:

$$R'_m(H)_kSiX_{4-(m+k)} \quad (I)$$

(wherein X is a hydrolysable and polycondensable group, e.g., a halogen atom (e.g., chlorine or bromine) or —OR; R is an alkyl group of 1 to 4 carbon atoms or an alkyl carbonyl group of 1 to 4 carbon atoms; R' is a non-reactive group, e.g., an alkyl group of 1 to 4 carbon atoms or an aryl group (e.g., a phenyl group); "k" is 1 or 2; "m" is 0 or 1; and "m+k" is 1 or 2). The silane compound represented by the general formula (I) is hydrolyzed and polycondensed into a silicone polymer containing the Si—H group, which undergoes hydrosilylation by the hydrosilylation agent to form the silicone polymer provided with a resin-settable functional group.

The silane compound containing the Si—H group, represented by the general formula (I), may be used in combination with a silane compound represented by the general formula (II):

$$R'_nSiX_{4-n} \quad (II)$$

(wherein R' and X are the same as those for the general formula (I); and "n" is an integer of 0 to 2).

More specifically, the silane compounds containing the Si—H group, represented by the general formula (I), useful for the present invention include:

bi-functional silane compounds, e.g., alkyl dialkoxy silanes, e.g., $HCH_3Si(OCH_3)_2$, $HC_2H_5Si(OCH_3)_2$, $HC_3H_7Si(OCH_3)_2$, $HC_4H_9Si(OCH_3)_2$, $HCH_3Si(OC_2H_5)_2$, $HC_2H_5Si(OC_2H_5)_2$, $HC_3H_7Si(OC_2H_5)_2$, $HC_4H_9Si(OC_2H_5)_2$, $HCH_3Si(OC_3H_7)_2$, $HC_2H_5Si(OC_3H_7)_2$, $HC_3H_7Si(OC_3H_7)_2$, $HC_4H_9Si(OC_3H_7)_2$, $HCH_3Si(OC_4H_9)_2$, $HC_2H_5Si(OC_4H_9)_2$, $HC_3H_7Si(OC_4H_9)_2$ and $HC_4H_9Si(OC_4H_9)_2$, dialkoxy silanes, e.g., $H_2Si(OCH_3)_2$, $H_2Si(OC_2H_5)_2$, $H_2Si(OC_3H_7)_2$ and $H_2Si(OC_4H_9)_2$, and phenyl dialkoxy silanes, e.g., $HPhSi(OCH_3)_2$, $HPhSi(OC_2H_5)_2$, $HPhSi(OC_3H_7)_2$ and $HPhSi(OC_4H_9)_2$, and tri-functional silane compounds, e.g., trialkoxy silanes, e.g., $HSi(OCH_3)_3$, $HSi(OC_2H_5)_3$, $HSi(OC_3H_7)_3$ and $HSi(OC_4H_9)$, wherein Ph means a phenyl group, and functionality of a silane compound means that it has a condensable functional group.

The silane compounds represented by the general formula (II) useful for the present invention specifically include:

tetra-alkoxy silanes, e.g., tetraalkoxysilanes, e.g., $Si(OCH_3)_4$, $Si(OC_2H_5)_4$, $Si(OC_3H_7)_4$ and $Si(OC_4H_9)_4$;

tri-functional silane compounds, e.g., monoalkyl trialkoxysilanes, e.g., $H_3CSi(OCH_3)_3$, $H_5C_2Si(OCH_3)_3$, $H_7C_3Si(OCH_3)_3$, $H_9C_4Si(OCH_3)_3$, $H_3CSi(OC_2H_5)_3$, $H_5C_2Si(OC_2H_5)_3$, $H_7C_3Si(OC_2H_5)_3$, $H_9C_4Si(OC_2H_5)_3$, $H_3CSi(OC_3H_7)_3$, $H_5C_2Si$ $(OC_3H_7)_3$, $H_7C_3Si(OC_3H_7)_3$, $H_9C_4Si(OC_3H_7)_3$, $H_3CSi(OC_4H_9)_3$, $H_5C_2Si(OC_4H_9)_3$, $H_7C_3Si(OC_4H_9)_3$ and $H_9C_4Si(OC_4H_9)_3$, phenyl trialkoxysilane, e.g., $PhSi(OCH_3)_3$, $PhSi(OC_2H_5)_3$, $PhSi(OC_3H_7)_3$ and $PhSi(OC_4H_9)_3$, monoalkyl triacyloxysilanes, e.g., $(H_3CCOO)_3SiCH_3$, $(H_3CCOO)_3SiC_2H_5$, $(H_3CCOO)_3SiC_3H_7$ and $(H_3CCOO)_3SiC_4H_9$, monoalkyl trihalogenosilanes, e.g.

$Cl_3SiCH_3$, $Cl_3SiC_2H_5$, $Cl_3SiC_3H_7$, $Cl_3SiC_4H_9$, $Br_3SiCH_3$, $Br_3SiC_2H_5$, $Br_3SiC_2H_7$ and $Br_3SiC_4H_9$; and bi-functional silane compounds, e.g., dialkyl dialkoxysilanes, e.g., $(H_3C)_2Si(OCH_3)_2$, $(H_5C_2)_2Si(OCH_3)_2$, $(H_7C_3)_2Si(OCH_3)_2$, $(H_9C_4)_2Si(OCH_3)_2$, $(H_3C)_2Si(OC_2H_5)_2$, $(H_5C_2)_2Si(OC_2H_5)_2$, $(H_7C_3)_2Si(OC_2H_5)_2$, $(H_9C_4)_2Si(OC_2H_5)_2$, $(H_3C)_2Si(OC_3H_7)_2$, $(H_5C_2)_2Si(OC_3H_7)_2$, $(H_7C_3)_2Si(OC_3H_7)_2$, $(H_9C_4)_2Si(OC_3H_7)_2$, $(H_3C)_2Si(OC_4H_9)_2$, $(H_5C_2)_2Si(OC_4H_9)_2$, $(H_7C_3)_2Si(OC_4H_9)_2$ and $(H_9C_4)_2Si(OC_4H_9)_2$, diphenyl dialkoxysilanes, e.g., $Ph_2Si(OCH_3)_2$ and $Ph_2Si(OC_2H_5)_2$, dialkyl diacyloxysilanes, e.g., $(H_3CCOO)_2Si(CH_3)_2$, $(H_3CCOO)_2Si(C_2H_5)_2$, $(H_3CCOO)_2Si(C_3H_7)_2$ and $(H_3CCOO)_2Si(C_4H_9)_2$, and alkyl dihalogenosilanes, e.g., $Cl_2Si(CH_3)_2$, $Cl_2Si(C_2H_5)_2$, $Cl_2Si(C_3H_7)_2$, $Cl_2Si(C_4H_9)_2$, $Br_2Si(CH_3)_2$, $Br_2Si(C_2H_5)_2$, $Br_2Si(C_3H_7)_2$ and $Br_2Si(C_4H_9)_2$, wherein Ph means a phenyl group, and functionality of a silane compound means that it has a condensable functional group.

The silane compound containing the Si—H group, represented by the general formula (I), is the essential component for the present invention, and the silane compound represented by the general formula (II) is an optional component. The hydrolysable and polycondensable group in the silane compound represented by the general formula (I) or (II) is preferably an alkoxy group due to its reactivity.

The silane compound containing the Si—H group, represented by the general formula (I), is particularly preferably a trialkoxysilane or monoalkyl dialkoxysilane, and the silane compound represented by the general formula (II) is particularly preferably a tetraalkoxysilane, monoalkyl trialkoxysilane or dialkyl dialkoxysilane. When the silicone compound of a high degree of polymerization is to be produced, the silane compound represented by the general formula (I) particularly preferably contains a tri-functional silane compound, and the silane compound represented by the general formula (II), when used, particularly preferably contains a tetra- or tri-functional silane compound represented by the general formula (II).

For the process of the present invention for producing a silicone polymer, a silane compound having the Si—H group accounts for at least 35% by mol of the total silane compounds. It is preferable that a silane compound having the Si—H group, represented by the general formula (I), accounts for 35 to 100% by mol of the total silane compounds, more preferably 35 to 85%, and a silane compound represented by the general formula (II) for 0 to 65%, more preferably 15 to 65%.

The silicone polymer of the present invention is preferably three-dimensionally crosslinked, for which it is preferable that 3 to 100% by mol of the total silane compounds are tri-functional or compounds of higher functionality and particularly preferable 3 to 75% by mol. It is also preferable that 15 to 100% by mol, more preferably 20 to 85%, of the total silane compounds are tetra- or tri-functional. In other words, it is preferable that 0 to 85% by mol, more preferably 0 to 80%, of the silane compounds represented by the general formula (II) are bi-functional. It is particularly preferable that 15 to 100% by mol, more preferably 20 to 100%, of the silane compounds represented by the general formula (II) are tetra-functional; 0 to 85%, more preferably 0 to 80%, are tri-functional; and 0 to 85%, more preferably 0 to 80%, are bi-functional.

When bi-functional silane compound(s) account for more than 85% by mol of the silane compounds represented by the general formula (II), the resultant silicone polymer may have excessively long chains, which will probably lie across the inorganic material surface, due to orientation of the hydrophobic group, e.g., methyl, tending to form a rigid layer which makes it is difficult for the polymer to realize low stress.

The silicone polymer of the present invention is produced by hydrolysis, polycondensation and hydrosilylation of a silane compound having the Si—H group, represented by the general formula (I), and silane compound represented by the general formula (II). Suitable catalysts for hydrolysis and polycondensation include inorganic acids, e.g., hydrochloric, sulfuric, phosphoric, nitric and hydrofluoric acid, and organic acids, e.g., oxalic, maleic, sulfonic and formic acid. A Basic catalyst, e.g., ammonia or trimethyl ammonium, may be also used. The quantity of the catalyst to be used is adequately set in accordance with the quantity of the silane compound having the Si—H group, represented by the general formula (I), and that of the silane compound represented by the general formula (II). It is however used preferably at 0.001 to 10 mols per mol of the total silane compounds represented by the general formula (I) and (II). The hydrosilylation catalysts useful for the present invention include those based on transition metal compounds, e.g., platinum-, palladium- and rhodium-based ones. The particularly useful ones are those of platinum-based ones, e.g., chloroplatinic acid. Those compounds useful as the catalyst for the present invention also include peroxides, e.g., zinc, calcium, hydrogen, di-tert-butyl, strontium, sodium lead and barium peroxide; and a ternary amine and phosphine. The hydrosilylation catalyst is used preferably at 0.0000001 to 0.0001 mols per mol of the Si—H group in the silane compound containing the Si—H group, represented by the general formula (I).

The hydrosilylation agent for the present invention has a double bond, e.g., a vinyl group, for hydrosilylation and a resin-setting functional group, e.g., epoxy or amino. The resin-setting functional group is a group which reacts or interacts with an organic or inorganic compound. These functional groups include reactive organic groups reactive with a setting or crosslinking agent; self-setting reactive organic groups; organic groups reacting or interacting with a functional group present on an inorganic filler surface; and groups reactive with a hydroxylic group. More specifically, they include hydrosilylation agents having an epoxy group, e.g., an acyl glycidyl ether; and hydrosilylation agents having an amino group, e.g., an acyl amine, allyl amine hydrochloride, aminoalkyl acrylate (e.g., aminoethyl acrylate) and aminoalkyl methacrylate (e.g., aminoethyl methacrylate). The hydrosilylation agent is used preferably at 0.1 to 2 equivalents per equivalent of the Si—H group in the silane compound containing the Si—H group, represented by the general formula (I), more preferably 0.5 to 1.5 equivalents, still more preferably 0.9 to 1.1 equivalents.

The hydrolysis/polycondensation and subsequent hydrosilylation are preferably effected in a solvent. The suitable solvents for the present invention include alcohol-based ones, e.g., methanol and ethanol; ether-based ones, e.g., ethylene glycol monomethyl ether; ketone-based ones, e.g., acetone, methylethylketone and methylisobutylketone; amide-based ones, e.g., N,N-dimethylformamide; aromatic hydrocarbon-based ones, e.g., toluene and xylene; ester-based ones, e.g., ethyl acetate; and nitrile-based ones, e.g., butyronitrile. They may be used either individually or in combination. The hydrolysis/polycondensation can proceed in atmospheric conditions in the absence of water, but may be effected in the presence of water. The quantity of water to be used is set adequately. However, it is preferably used at 0 to 5 mols per mol of the total silane compounds, more preferably 0.5 to 4 mols, because some problems, e.g., deteriorated storage stability of the coating solution, may occur when it is present in excessive quantities.

The silicone polymer is produced under the above conditions, while the composition is set in such a way that it is not gelled. The silicone polymer is preferably dissolved in the same reaction solvent as described above before use for workability. Therefore, the as-received reaction effluent solution may be used directly, or the silicone polymer may be dissolved in the above solvent after being separated from the effluent solution.

The silicone polymer of the present invention is three-dimensionally crosslinked but without being completely set or gelled. Its polymerization is controlled, e.g., to an extent that it is soluble in a reaction solvent. Therefore, the temperature at which the resin-setting silicone polymer is produced, stored or used is preferably in a range from normal temperature to 200° C., and more preferably 150° C. or lower.

For production of the silicone polymer of the present invention, a silicone polymer containing the Si—H group can be produced as an intermediate, where its Si—H group is derived from a bi- or tri-functional siloxane unit represented by the formula $HR'SiO_{2/2}$ (wherein R' is the same as described earlier, and when 2 or more types of R's are present in the unit, they may be the same or different), $H_2SiO_{2/2}$ or $HSiO_{3/2}$, all of which has the Si—H group.

The degree of polymerization of the silicone polymer of the present invention is not limited, so long as it is 3 or more. However, it is preferably 7,000 or less, more preferably 2,000 or less in consideration of efficiency when it is used in the form of solution, still more preferably 3 to 500. The silicone polymer has the resin-settable functional group in the side chain or at the terminal, which is included by the hydrosilylation with the Si—H group. The degree of polymerization of the silicone polymer is estimated from molecular weight of the polymer in the case of low polymerization degree, or from a number-average molecular weight of the polymer determined by gel permeation chromatography from a calibration curve of the standard polystyrene or polyethylene glycol.

For production of the silicone polymer of the present invention, the hydrosilylation agent may be incorporated after the silicone polymer is produced to act thereon, as described earlier, or together with the silane compound to effect the hydrosilylation simultaneously with, or during the hydrolysis/polycondensation.

The thermosetting resin composition containing the silicone polymer having the resin-settable functional group (referred to as the resin-settable silicone polymer in this specification) may be incorporated with a high content of an inorganic filler. The inorganic filler useful for the present invention is not limited. Useful inorganic fillers include calcium carbonate, alumina, titanium oxide, mica, aluminum carbonate, aluminum hydroxide, magnesium silicate, aluminum silicate, silica, short glass fibber, and whiskers of, e.g., aluminum borate and silicon carbide. These fillers may be used either individually or in combination. The shape and size of the inorganic filler are not limited. Those normally used are ones having a particle size of 0.001 to 50 μm and may also be used for the present invention. They preferably have a size of 0.01 to 10 μm. The filler is preferably incorporated at 100 to 2,000 parts by weight with respect to 100 parts by weight of the resin-settable silicone polymer, and more preferably 300 to 1,500 parts by weight.

The resin-settable silicone polymer tends to have an excessive thermal expansion coefficient when the content of the inorganic filler is insufficient, and may be difficult to form into a film when it is excessive.

The setting agent for the thermosetting resin composition of the present invention containing the silicone polymer is not limited, so long as it reacts with the resin-settable functional group in the silicone polymer to set the composition. For example, those commonly used for epoxy resins, e.g., amine- and phenol-based ones, may be used when an epoxy group is the resin-settable functional group. The setting agent for epoxy resins is preferably of a multi-functional phenol compound. These compounds include bisphenol A, bisphenol F, bisphenol S, resorcin and catechol. A novolac resin, which is produced by reacting a multi-functional phenol or monovalent phenol compound (e.g., phenol or cresol) with formaldehyde, can be also used. The multi-functional phenol compound may be substituted with a halogen, e.g., bromine. The setting agent is incorporated preferably at 0.2 to 1.5 equivalents per equivalent of the resin-settable functional group in the silicone polymer, particularly preferably 0.5 to 1.2 equivalents. The setting agent for epoxy resins is preferably incorporated with an amine compound to improve adhesion between the set composition and metal. It is preferably incorporated excessively. The amine compound functions as an agent to reinforce adhesion, and the specific compounds useful for the present invention are described later. The setting agent containing an amine compound is incorporated preferably at 1.0 to 1.5 equivalents per equivalent of the resin-settable functional group in the silicone polymer in consideration of the balance adhesion and other characteristics, e.g., heat resistance, and more preferably 1.0 to 1.2 equivalents.

A setting promoter may be used together with a setting agent. An imidazole compound or the like may be commonly used as the setting promoter, when an epoxy group is the resin-settable functional group. More specifically, the imidazole compounds useful as the setting promoter include imidazole, 2-ethylimidazole, 2-ethyl-4-methylimidazole, 2-phenylimidazole, 2-undecylimidazole, 1-benzyl-2-methylimidazole, 2-heptadecylimidazole, 4,5-diphenylimidazole, 2-methylimidazoline, 2-phenylimidazoline, 2-undecylimidazoline, 2-heptadecylimidazoline, 2-isopropylimidazole, 2,4-dimethylimidazole, 2-phenyl-4-methylimidazole, 2-ethylimidazoline, 2-isopropylimidazoline, 2,4-dimethylimidazoline and 2-phenyl-4 methylimidazoline. The setting promoter is incorporated preferably at 0.01 parts by weight or more with respect to 100 parts by weight of the silicone polymer to exhibit its effects sufficiently, and preferably at 10 parts by weight or less in consideration of the thermal expansion coefficient, elongation or the like.

The thermosetting resin composition of the present invention containing the silicone polymer may be incorporated, as required, with an elastomer modified to have a silyl group at both terminals. Incorporation of the silyl-modified elastomer improves breaking stress and handleability of the resultant resin, after it has been set. It is a long-chain elastomer having a weight-average molecular weight of around 3,000 to 100,000, with an alkoxysilyl group at both terminals of the main chain. The elastomer's main chain is not limited. Elastomers useful for the present invention include those having a main chain structure of polyolefin (e.g., polyisobutylene or polypropylene), polyether (e.g., polypropylene oxide), or butadiene or acrylic rubber. The alkoxysilyl group useful for the present invention may have 1 to 3 alkoxy groups bonded to the Si atom, and the alikoxy group bonded to the Si atom preferably has 1 to 4 carbon atoms. The specific examples of the elastomer modified to have the silyl group at both terminals include sily-modified polyether (manufactured by KANEKA CORPORATION; SAT 200) and silyl-modified polyisobutylene (manufactured by KANEKA CORPORATION; EP103S and EP303S). It is incorporated preferably at 0.1 to 30 parts by weight with respect to 100 parts by weight of the 100 parts by weight of the silicone polymer. It may not fully exhibit its effect when incorporated at below 0.1 parts by weight, and tends to increase the thermal expansion coefficient of the resin composition at above 30 parts by weight.

For the thermosetting resin composition of the present invention, a silicone oil having an epoxy group (referred to as the epoxy-modified silicone oil in this specification) may be used in combination with the resin-setting silicone polymer of the present invention. The resin-setting silicone polymer is incorporated preferably at 0.1 parts by weight or more with respect to 100 parts by weight of the total of the resin-setting silicone polymer and epoxy-modified silicone oil, more preferably at 5 parts by weight or more in consideration of the thermal expansion coefficient, elongation and breaking stress, still more preferably at 20 parts by weight or more. On the other hand, the epoxy-modified silicone oil is incorporated preferably at 5 parts by weight or more with respect to 100 parts by weight of the total of the resin-setting silicone polymer and epoxy-modified silicone oil in consideration of elongation and breaking stress, particularly preferably at 40 parts by weight. Dispersibility of the inorganic filler may be deteriorated when the resin-setting silicone oil is incorporated at below 0.1 parts by weight. Ratio of the resin-setting silicone oil to the epoxy-modified silicone oil can be determined in consideration of the thermal expansion coefficient and elongation for specific purposes. The increasing ratio of the resin-setting silicone polymer decreases the thermal expansion coefficient, and the increasing ratio of the epoxy-modified silicone oil increases elongation. The epoxy-modified silicone oil is a chain-structured polysiloxane compound having a functional group with an epoxy group in the side chain, and having a viscosity of $10^{-2}$ to $10^3$ Pa·s at 25° C. Viscosity of the present invention was determined at 25° C. by an EMD type viscometer (manufactured by Tokyo Keiki). The epoxy-modified silicone oil preferably has epoxy equivalents of 150 to 5,000, and particularly preferably 300 to 1,000.

In the thermosetting resin composition containing the epoxy-modified silicone oil, the resin-setting silicone polymer of the present invention may be partly or totally replaced by a silicone polymer free of a resin-setting function (referred to as the silicone polymer having a non-resin setting function in this specification). The silicone polymer having the non-resin setting function, when used, is preferably incorporated at 30 parts by weight or less with respect to 100 parts by weight of the total of the epoxy-modified silicone oil and the silicone polymer. It may deteriorate elongation of the resin composition, when incorporated at above 30 parts by weight.

The silicone polymer having the non-resin setting function is a polymer which contains at least one of bi-, tri- and tetra-functional siloxane unit represented by the formula $R_2SiO_{2/2}$, $RSiO_{3/2}$ and $SiO_{4/2}$, respectively (wherein R is an organic group, and when 2 or more types of Rs are present in the unit, they may be the same or different), and also has at least one terminal functional group reactive with a hydroxyl group. Its degree of polymerization is preferably 2 to 7,000, more preferably 2 to 100, still more preferably 2 to 70. R in the above formula is an alkyl group of 1 to 4 carbon atoms, an aromatic group (e.g., phenyl) or the like. The functional group reactive with a hydroxyl group is a silanol group, an alkoxyl group of 1 to 4 carbon atoms, an acyloxy group of 1 to 4 carbon atoms, a halogen atom other than bromine (e.g., chlorine) or the like.

The silicone polymer having the non-resin setting function can be produced by hydrolysis and subsequent polycondensation of a silane compound represented by the general formula (II). A tetra- or tri-functional silane compound is essential for production of the silicone polymer having the non-resin setting function, and a bi-functional one may be used as required. Particularly preferable tetra-, tri- and bi-functional silane compounds are tetraalkoxy silane, monoalkyl trialkoxysilane and dialkyl dialkoxysilane, respectively. When a mixture of these silane compounds is used as the starting material, the tetra- or tri-functional one preferably accounts for 15 to 100% by mol and the bi-functional one for 0 to 85% by mol. More preferably, the tetra- and/or tri-functional ones account for 20 to 100% by mol, and the bi-functional one for 0 to 80% by mol. Still more preferably, the tetra-, tri- and bi-functional ones account for 15 to 100, 0 to 85 and 0 to 85% by mol, respectively, and still more preferably 20 to 100, 0 to 80 and 0 to 80% by mol, respectively. The catalyst and solvent for the hydrolysis and polycondensation may be the same as those used for production of the resin-setting silicone polymer.

For production of the silicone polymer having the non-resin setting function, the conditions and composition are set in such a way that it is not gelled. It is three-dimensionally crosslinked but without being completely set or gelled. Its polymerized is controlled, e.g., to an extent that it is soluble in a reaction solvent. Therefore, the temperature at which it is produced, stored or used is preferably in a range from normal temperature to 200° C., and more preferably 150° C. or lower.

When the resin-setting silicone polymer or the silicone polymer having the non-resin setting function is used in combination with the epoxy-modified silicone oil, the resin-setting silicone polymer is a more preferable silicone polymer component than the silicone polymer having the non-resin setting function alone for thermal expansion, elongation and breaking stress of the resin composition. Use of the resin-setting silicone polymer alone as the silicone polymer component is particularly preferable.

The thermosetting resin composition of the present invention may be incorporated with, as required, an agent for reinforcing adhesion, to improve its adhesion and peel strength with a metallic foil. A compound having 2 or more reactive functional groups, e.g., amino or a hydroxyl group, may be used as the adhesion-reinforcing agent. It can also work as a setting agent for epoxy resin. Amine compounds having 2 or more reactive functional groups include those having 2 or more amino groups in the molecule, e.g., m-phenylene diamine, 4,4'-diaminobenzanilide and 4,4'-diamino-2,2'-dimethyl biphenyl; those having 2 or more active N—H groups in the molecule, e.g., dicyandiamide; and those having amino and hydroxyl groups in the molecule, e.g., 3-amino-1-propanol and 4-aminophenol. The adhesion-reinforcing agent is incorporated preferably at 0.01 to 9 parts by weight with respect to 100 parts by weight of the silicone polymer, more preferably 0.1 to 6 parts by weight. It may be difficult to fully exhibit its effect when incorporated at below 0.01 parts by weight, and tends to deteriorate resistance of the resin composition to heat, after it has been set, when incorporated at above 9 parts by weight.

It is known that an inorganic filler, when incorporated in a thermosetting resin, can generally reduce the thermal expansion coefficient of the resultant resin composition and improve its characteristics, e.g., heat resistance, required for wiring boards, but may deteriorate its tensile strength and low stress, after it has been set, when incorporated excessively. It has been difficult for the conventional approach to simultaneously satisfy the low thermal expansion coefficient and low stress of a thermosetting resin to a high level. The present invention can solve these problems to provide a thermosetting resin which can simultaneously satisfy the low thermal expansion coefficient and low stress. More specifically, the present invention provides a thermosetting resin having a thermal expansion coefficient of $50\times10^{-6}$/° C. or less after it has been set and an elongation of 1.0% or more as determined by the tensile test after it has been set, as a resin which simultaneously achieves the low thermal expansion coefficient and low stress. It is possible for a thermosetting resin composition to simultaneously achieve the low thermal expansion coefficient and low stress, when it is so adjusted as to simultaneously satisfy a thermal expansion coefficient of $50\times10^{-6}$/° C. or less after it has been set and an elongation of 1.0% or more as determined by the tensile test after it has been set. Particularly preferably, the thermal expansion coefficient is $30\times10^{-6}$/° C. or less and elongation of 2.0% or more. There is no lower limit for the thermal expansion coefficient, and lower is better. However, $3\times10^{-6}$/° C. or more is sufficient, and $5\times10^{-6}$/° C. or more is preferable at present in consideration of the balance with other characteristics. One of the examples of the thermosetting resin composition simultaneously achieving the low thermal expansion coefficient and low stress is a composition composed of a chain-structured resin containing an epoxy group in the molecule (e.g., epoxy-modified silicone oil), a thermosetting resin (e.g., the resin-setting silicone polymer of the present invention), a setting agent, an inorganic filler, and as required, a dispersant. The silicone polymer having a non-resin setting function or the like may be used as the dispersant. The thermosetting resin composition of the present invention, composed of the resin-setting silicone polymer, the setting agent and the inorganic filler, can have a very low thermal expansion coefficient of $30\times10^{-6}$/° C. or less, or even $15\times10^{-6}$/° C. or less, after it has been set.

Moreover, the inventors of the present invention have found that the excellent characteristics of low stress and low thermal expansion can be realized for the thermosetting resin composition, when the thermosetting resin is incorporated with an inorganic filler at 100 parts by weight or more with respect to 100 parts by weight of the resin, and adjusted to have an elongation of 1.0% or more as determined by the tensile test after it has been set. The thermosetting resin composition can simultaneously achieve the low thermal expansion coefficient and low stress, when the thermosetting resin is incorporated with an inorganic filler at 100 parts by weight or more with respect to 100 parts by weight of the resin, and adjusted to have an elongation of 1.0% or more as determined by the tensile test after it has been set. Particularly preferably, the thermosetting resin is incorporated with an inorganic filler at 800 parts by weight or more with respect to 100 parts by weight of the resin, and has an elongation of 2.0% or more and a thermal expansion coefficient of $50\times10^{-6}$/° C. or less. One of the examples of the thermosetting resin composition incorporated with a high proportion of an inorganic filler and having low stress is a composition composed of a chain-structured resin containing an epoxy group in the molecule (e.g., epoxy-modified silicone oil), a thermosetting resin (e.g., the resin-setting silicone polymer of the present invention), a setting agent, an inorganic filler, and as required, a dispersant. The silicone polymer having the non-resin setting function or the like may be used as the dispersant.

The inventors of the present invention have also found that the excellent characteristics of low stress and low thermal expansion can be realized for the thermosetting resin composition, when content F of the inorganic filler (parts by weight with respect to 100 parts of the thermosetting resin) and elongation X (%) of the composition determined by the tensile test after it has been set satisfy the relationship $F\times X>800$. The thermosetting resin composition can simultaneously achieve the low thermal expansion coefficient and low stress, when it is adjusted to satisfy the relationship $F\times X>800$. One of the examples of the thermosetting resin composition simultaneously achieving the low thermal expansion coefficient and low stress is a composition composed of a chain-structured resin containing an epoxy group in the molecule (e.g., epoxy-modified silicone oil), a thermosetting resin (e.g., the resin-setting silicone polymer of the present invention), a setting agent, an inorganic filler, and as required, a dispersant. The silicone polymer having the non-resin setting function or the like may be used as the dispersant. The resin composition preferably has a thermal expansion coefficient of $50\times10^{-6}$/° C. or less after it has been set, and an elongation of 1.0% or more as determined by the tensile test after it has been set.

It is known that an inorganic filler, when incorporated excessively, generally decreases the breaking stress of the resultant resin composition after it has been set, making it difficult for the formed article to keep its shape and deteriorating its handleability. The present invention can solve these problems to provide a thermosetting resin which can simultaneously satisfy the low thermal expansion coefficient and low stress. More specifically, the present invention provides a thermosetting resin having a thermal expansion coefficient of $50\times10^{-6}$/° C. or less and breaking stress of 2 MPa or more after it has been set, as the one which simultaneously achieves the low thermal expansion coefficient and low stress. It is possible for a thermosetting resin composition to simultaneously achieve the low thermal expansion coefficient and sufficient handleability, when it is so adjusted as to simultaneously satisfy a thermal expansion coefficient of $50\times10^{-6}$/° C. or less and breaking stress of 2 MPa or more after it has been set. Particularly preferably, the thermal expansion coefficient is $30\times10^{-6}$/° C. or less and breaking stress of 6 MPa or more. One of the examples of the thermosetting resin composition simultaneously achieving low thermal expansion coefficient and sufficient handleability is a thermosetting resin composition comprising a thermosetting resin (e.g., the resin-setting silicone polymer of the present invention), a setting agent and an inorganic filler. The thermosetting resin composition simultaneously achieving the low thermal expansion coefficient and sufficient handleability preferably has an elongation of 1.0% or more, after it has been set, in consideration of securing low stress, more preferably 2.0% or more. It is also preferable that the resin composition contains an elastomer modified with the silyl group at both terminals, or epoxy-modified silicone oil, in order to have a high breaking stress.

The inventors of the present invention have also found that excellent handleability and low thermal expansion can be realized for the thermosetting resin composition, when the thermosetting resin is incorporated with an inorganic filler at 100 parts by weight or more with respect to 100 parts by weight of the resin, and adjusted to have a breaking stress of 2 MPa or more after it has been set, The thermosetting resin composition can simultaneously achieve the low thermal expansion coefficient and sufficient handleability, when the thermosetting resin is incorporated with an inorganic filler at 100 parts by weight or more with respect to 100 parts by weight of the resin, and adjusted to have a breaking stress of 2 MPa or more after it has been set. One of the examples of the thermosetting resin composition simultaneously achieving the low thermal expansion coefficient and sufficient handleability is a composition comprising a chain-structured resin containing an epoxy group in the molecule (e.g., epoxy-modified silicone oil), a thermosetting resin (e.g., the resin-setting silicone polymer of the present invention), a setting agent, an inorganic filler, and as required, a dispersant. The silicone polymer having the non-resin setting function or the like may be used as the dispersant. Particularly preferably, the thermosetting resin is incorporated with an inorganic filler at 800 parts by weight or more with respect to 100 parts by weight of the resin, and has a breaking stress of 6 MPa or more and a thermal expansion coefficient of $50\times10^{-6}/°$ C. or less. The thermosetting resin composition preferably has an elongation of 1.0% or more as determined by the tensile test after it has been set, in consideration of securing low stress. It is also preferable that the resin composition contains an elastomer modified with the silyl group at both terminals, or epoxy-modified silicone oil, in order to have a high breaking stress.

It is also known that an inorganic filler, when incorporated excessively, generally deteriorates adhesion of the set resin composition to a metallic foil greatly. The present invention can solve these problems to provide a thermosetting resin which can control deterioration of adhesion resulting from the decreased thermal expansion coefficient, to keep sufficient adhesion to a metallic foil. More specifically, the present invention provides a thermosetting resin composition having a thermal expansion coefficient of $50\times10^{-6}/°$ C. or less and a peel strength of 0.5 kN/m or more with a metallic foil, after it has been set, in order to secure the adhesion and low thermal expansion coefficient sufficient for realizing high reliability of the electric/electronic devices in which it is used. Particularly preferably, the thermal expansion coefficient is $30\times10^{-6}/°$ C. or less. It is possible for a thermosetting resin composition to simultaneously achieve the low thermal expansion coefficient and sufficient adhesion, when it is so adjusted as to simultaneously satisfy a thermal expansion coefficient of $50\times10^{-6}/°$ C. or less and a peel strength of 0.5 kN/m or more with an electroconductive layer after it has been set. The thermosetting resin composition simultaneously achieving the sufficient adhesion and low thermal expansion coefficient preferably has an elongation of 1.0% or more after it has been set, in consideration of securing low stress. It can also exhibit excellent handleability, when so adjusted to have a breaking stress of 2 MPa or more after it has been set. Particularly preferably, the thermal expansion coefficient is $30\times10^{-6}/°$ C. or less, breaking stress is 6 MPa or more, and elongation is 2.0% or more. One of the examples of the thermosetting resin composition simultaneously achieving the sufficient adhesion and low thermal expansion coefficient is a thermosetting resin composition comprising a chain-structured resin containing an epoxy group in the molecule (e.g., epoxy-modified silicone oil), a thermosetting resin (e.g., the resin-setting silicone polymer of the present invention), a setting agent, an inorganic filler, and as required, a dispersant. The silicone polymer having the non-resin setting function or the like may be used as the dispersant. The thermosetting resin composition is preferably incorporated with an amine compound having 2 or more reactive functional groups, to improve its adhesion.

The inventors of the present invention have also found that sufficient adhesion and low thermal expansion can be realized for the thermosetting resin composition, when the thermosetting resin is incorporated with an inorganic filler at 100 parts by weight or more with respect to 100 parts by weight of the resin, and adjusted to have a peel strength of 0.5 kN/m or more after it has been set. The thermosetting resin composition can simultaneously achieve the low thermal expansion coefficient and sufficient adhesion, when the thermosetting resin is incorporated with an inorganic filler at 100 parts by weight or more with respect to 100 parts by weight of the resin, and adjusted to have a peel strength of 0.5 kN/m or more after it has been set. One of the examples of the thermosetting resin composition simultaneously achieving the sufficient adhesion and low thermal expansion coefficient is a composition comprising a chain-structured resin containing an epoxy group in the molecule (e.g., epoxy-modified silicone oil), a thermosetting resin (e.g., the resin-setting silicone polymer of the present invention), a setting agent, an inorganic filler, and as required, a dispersant. The silicone polymer having the non-resin setting function or the like may be used as the dispersant. Particularly preferably, the thermosetting resin is incorporated with an inorganic filler at 800 parts by weight or more with respect to 100 parts by weight of the resin. It is also preferable that the resin composition has an elongation of 1.0% or more as determined by the tensile test after it has been set in consideration of securing low stress, a breaking stress of 2 MPa or more after it has been set in consideration of handleability, and is incorporated with an amine compound having 2 or more reactive functional groups to improve its adhesion.

The thermosetting resin composition of the present invention may be used as a resin varnish, after its components are dissolved or dispersed in the organic solvent described earlier. It may be formed into a carrier-supported resin film, when spread on the carrier sheet and dried. When the thermosetting resin composition is spread, is thickness of the resultant film can be controlled for specific purposes. It is however preferable to control thickness of the film in a range from 10 to 150 μm after it has been set, The varnish is spread, when so required, preferably by a coater which can apply a shear stress in the direction in parallel to the carrier sheet plane, or compressive stress in the direction perpendicular to the carrier sheet plane. Such coaters include a blade, rod, knife, squeeze, reverse roll and transfer coater. Drying temperature is preferably in a range from 80 to 200° C. Setting conditions for the resin film can be controlled by adjusting drying time. When the resin film is dried to a semi-set condition, for example, drying time may be controlled to prevent the film from being excessively set, preferably at 1 minute or more. When it is to be completely set, on the other hand, drying time is preferably set at 90 minutes or more. The carrier-supported resin film may be used as it is, or after the carrier sheet is peeled off. A core material, e.g., resin film of the resin composition of the present invention, resin film of another type of resin, base board, wiring board or the like, may be coated with the resin varnish described above on one or both sides and dried, to provide the resin layer of the thermosetting resin composition of the present invention on the core material.

The carrier sheet for production of the carrier-supported resin film may be a metallic foil (e.g., of copper or aluminum), resin film (e.g., of polyester, polyimide or polyethylene terephthalate) or the like, which may be coated with a mold releasing agent. The carrier sheet for the carrier-supported resin film is preferably coated with a mold releasing agent to improve its workability, when only the resin film of the resin composition of the present invention is used after the carrier sheet is peeled off from the carrier-supported resin film, or the carrier-supported resin film is placed on a base board and then only the carrier sheet is peeled off.

The resin film of the resin composition of the present invention may be used to produce a multi-layered resin film (e.g., 2-layered or 3-layered film) by coating it as a base film with one or more other types of resin on one or both sides. The resin layer on the base film may be of a laminate of polyester, polyimide, polyethylene terephthalte or the like formed into a monolithic structure, or may be formed by spreading and drying a resin varnish (e.g., of epoxy or phenol resin) by the procedure similar to that described earlier.

A multi-layered resin film (e.g., 2-layered or 3-layered film) can be also prepared by coating a base film of the resin composition of the present invention or another material, on one or both sides, with the carrier-supported resin film or resin film of the resin composition of the present invention to have a monolithic structure in such a way that the resin composition of the present invention comes into contact with the base. The resin film of another type of resin is not limited, and that of polyester, polyimide, polyethylene terephthalate or the like may be used for specific purposes.

A core material for prepreg may be coated with the resin layer of the resin composition of the present invention to provide the prepreg with desired characteristics, e.g., the low stress or low thermal expansion coefficient. The core may be a plate of metal, resin, inorganic material or the like, selected for specific conditions, e.g., handleability, weight, heat radiation or cost. The base board commonly used as a mother board for an electronic device, chip-supporting base board or the like may be used. The preferable base boards contain a resin (e.g., phenol, epoxy or polyimide resin) and paper or fibrous base (e.g., of aramid or glass fiber). The resin layer of the resin composition of the present invention may be produced by laminating the carrier-supported resin films or resin films of the resin composition of the present invention into a monolithic structure, or by spreading and drying the resin varnish of the resin composition of the present invention by the procedure similar to that described earlier.

A metallic foil provided with an insulation material can be produced by coating a metallic foil with a layer of the thermosetting resin composition of the present invention on one side. The metallic foil provided with an insulation material is produced by pressing, under heating, a laminate of the resin film of the resin composition of the present invention or carrier-supported resin film, or by spreading the resin varnish of the resin composition of the present invention on one side of a metallic film and drying it by the procedure similar to that described earlier. The metallic foil is not limited, but preferably copper foil for its electroconductivity and cost efficiency. The preferable copper foils include copper foil prepared by electrolysis to have a roughened surface on one side, commonly used for printed-wiring boards, rolled copper foil and very thin copper foil supported by a carrier sheet.

An insulation film coated with a metallic fail on each side can be produced by providing a metallic layer on each side of the resin layer of the resin composition of the present invention. The insulation film coated with a metallic foil on each side may be produced by, e.g., placing the above-described metallic foils provided with an insulation material one on another to have a monolithic structure in such a way that the insulation resin layers on the metallic foils come into contact with each other. These foils are preferably pressed, when pressing is adopted to have a monolithic structure, under a vacuum or normal pressure at 80 to 200° C. and 0.1 to 15 MPa for 0.1 to 120 minutes.

The resin layer composed of the resin composition of the present invention may be provided on a resin layer side of a metallic foil with an insulation material of another resin, to form a monolithic structure, thereby imparting the characteristics of the present invention, e.g., the low stress and low thermal expansion coefficient, to the metallic foil. The resins suitable as the insulation material for the metallic foil include phenol, epoxy and polyimide resin. The resin layer of the resin composition of the present invention may be provided by placing the carrier-supported resin films or resin films of the resin composition of the present invention one on another to have a monolithic structure, or by spreading and drying the resin varnish of the resin composition of the present invention by the procedure similar to that described earlier.

A metal-clad laminate may be produced by providing the resin layer of the present invention on one or both sides of the above-described core material and further providing a metallic layer on the resin layer. The resin layer of the resin composition of the present invention may be provided by placing the carrier-supported resin films or resin films of the resin composition of the present invention one on another to have a monolithic structure, or by spreading and drying the resin varnish of the resin composition of the present invention by the procedure similar to that described earlier. A monolithic structure of the laminated core material and resin film may be produced by putting the resin film on a base or wiring board by a hot roll laminator or the like. This procedure is simple, and hence preferable. The metal commonly used for producing metal-clad laminates may be directly used for the metallic layer. The preferable ones include copper and aluminum.

The metallic layer can be provided to have a monolithic structure by plating or placing a metallic foil. The metallic foil is preferably copper foil, e.g., the one prepared by electrolysis to have a roughened surface on one side, commonly used for printed-wiring boards, rolled copper foil or very thin copper foil supported by a carrier sheet. A metal-clad laminate can be also produced by providing the insulation material with a metallic foil on one or both sides of a resin layer to form a monolithic structure by a adequate method, e.g., pressing. Otherwise, the resin film of the resin composition of the present invention and a metallic foil may be placed on a core material to form a monolithic structure by an adequate method, e.g., pressing. They are preferably pressed, when pressing is adopted to have the monolithic structure, under a vacuum or normal pressure at 80 to 200° C. and 0.1 to 15 MPa for 0.1 to 120 minutes.

The insulation layer side of a single-sided metal-clad laminate only may be coated with the resin layer of the resin composition of the present invention to have a monolithic structure, to provide the metal-clad laminate with the desired characteristics of the resin composition of the present invention. A common laminate lined with a metal on one side may be directly used for the metal-clad laminate for the present invention. One of the examples of the metal-clad laminates comprises an insulation layer of a resin containing, e.g., phenol, epoxy or polyimide resin, paper or fibrous base (e.g., of aramid or glass fiber) and metal foil (e.g., copper foil) placed on one side of the laminate. The resin layer of the resin composition of the present invention may be produced by laminating the carrier-supported resin films or resin films of the resin composition of the present invention to form a monolithic structure, or by spreading and drying the resin varnish of the resin composition of the present invention by the procedure similar to that described earlier.

A multi-layered metal-clad laminate can be produced by spreading the resin varnish on an internal circuit board by the procedure similar to that described earlier, placing a metallic fail on the varnish layer, and pressing them under the conditions similar to those described earlier at elevated temperature and pressure. Moreover, an internal circuit board may be coated with the resin layer of the resin composition of the present invention and then with a metallic foil to form the multi-layered metal-clad laminate with the internal circuit board by pressing these components under heating. Still more, a multi-layered metal-clad laminate with an internal circuit board can be also produced by placing an internal circuit board on the metallic foil provided with an insulation material in such a way that the circuit layer in the former comes into contact with the insulation layer in the latter, and pressing these components under heating.

The multi-layered metal-clad laminate with the internal circuit formed on the internal circuit board electrically connected to an external circuit can be produced by providing the multi-layered metal-clad laminate with, e.g., the external circuit and connection between the internal and external circuits following the common procedures. Moreover, the multi-layered metal-clad laminate can be used to produce a multi-layered printed-circuit board, when it is provided with an insulation layer by laminating the carrier-supported resin films or resin films of the resin composition of the present invention into a monolithic structure, or by spreading and drying the resin varnish of the resin composition of the present invention by the procedure similar to that described earlier, and then provided with a circuit at a necessary position by the additive method or the like.

The resin layer of the resin composition of the present invention can be controlled to have a high elongation and low thermal expansion coefficient, and suitably used as the outermost insulation layer for a base material which supports an electronic device, e.g., semiconductor chip.

The present invention is described in more detail by EXPERIMENTAL EXAMPLES.

EXPERIMENTAL EXAMPLE A

A glass flask equipped with a stirrer, condenser and thermometer was charged with a solution of 20 g of tetramethoxysilane (10.4% by mol of the total silane compounds), 60 g of dimethoxydimethylsilane (39.6% by mol of the total silane compounds), 67 g of dimethoxymethylsilane (50.0% by mol of the total silane compounds) and 37 g of methanol as a synthetic solvent, to which 1.5 g of maleic acid as a synthetic catalyst and 50 g of distilled water were added. The mixture was stirred at 80° C. for 2 hours, to which 72 g of allylglycidyl ether and 0.2 g of chloroplatinate dissolved in isopropyl alcohol (2% by weight solution) were added, and the resultant mixture was stirred for 4 hours, to synthesize the epoxy-modified silicone polymer (A). The siloxane unit in the silicone polymer (A) had a polymerization degree of 65, estimated from the number-average molecular weight determined by GPC using the calibration curve of the standard polystyrene,

EXPERIMENTAL EXAMPLE B

The epoxy-modified silicone polymer (B) was prepared in the same manner as in EXPERIMENTAL EXAMPLE A, except that maleic acid as the synthetic catalyst was replaced by 1.2 g of phosphoric acid and a dose of chloroplatinate dissolved in isopropyl alcohol (2% by weight solution) was changed to 0.2 g. The siloxane unit in the silicone polymer (B) had a polymerization degree of 13.

EXPERIMENTAL EXAMPLE C

The epoxy-modified silicone polymer (C) was prepared in the same manner as in EXPERIMENTAL EXAMPLE A, except that allylglycidyl ether was replaced by 36 g of allylamine. The siloxane unit in the silicone polymer (C) had a polymerization degree of 18.

EXPERIMENTAL EXAMPLE D

The epoxy-modified silicone polymer (D) was prepared in the same manner as in EXPERIMENTAL EXAMPLE A, except that allylglycidyl ether was replaced by 60 g of allylamine hydrochloride. The siloxane unit in the silicone polymer (C) had a polymerization degree of 17.

EXPERIMENTAL EXAMPLE E

A solution of 25 g of tetramethoxysilane (12.5% by mol of the total silane compounds), 75 g of dimethoxydimethylsilane (47.4% by mol of the total silane compounds), 56 g of dimethoxymethylsilane (40.1% by mol of the total silane compounds) and 37 g of methanol as a synthetic solvent was incorporated with 1.5 g of maleic acid as a synthetic catalyst and 53 g of distilled water. The resultant mixture was stirred at 80° C. for 2 hours, to which 60 g of allylglycidyl ether and 0.2 g of chloroplatinate dissolved in isopropyl alcohol (2 by weight solution) were added, and the resultant mixture was stirred for 4 hours, to synthesize the epoxy-modified silicone polymer (E). The siloxane unit in the silicone polymer (E) had a polymerization degree of 31.

EXPERIMENTAL EXAMPLE F

A solution of 10 g of tetramethoxysilane (5.2% by mol of the total silane compounds), 30 g of dimethoxydimethylsilane (19.9% by mol of the total silane compounds), 100 g of dimethoxymethylsilane (74.9% by mol of the total silane compounds) and 37 g of methanol as a synthetic solvent was incorporated with 1.5 g of maleic acid as a synthetic catalyst and 53 g of distilled water. The resultant mixture was stirred at 80° C. for 2 hours, to which 108 g of allylglycidyl ether and 0.2 g of chloroplatinate dissolved in isopropyl alcohol (2% by weight solution) were added, and the resultant mixture was stirred for 4 hours, to synthesize the epoxy-modified silicone polymer (F). The siloxane unit in the silicone polymer (F) had a polymerization degree of 19.

EXPERIMENTAL EXAMPLE G

A solution of 20 g of trimethoxysilane (11.4% by mol of the total silane compounds), 60 g of dimethoxydimethylsilane (38.8% by mol of the total silane compounds), 68 g of dimethoxymethylsilane (49.8% by mol of the total silane compounds) and 37 g of methanol as a synthetic solvent was incorporated with 1.5 g of maleic acid as a synthetic catalyst and 49 g of distilled water. The resultant mixture was stirred at 80° C. for 2 hours, to which 74 g of allylglycidyl ether and 0.2 g of chloroplatinate dissolved in isopropyl alcohol (2% by weight solution) were added, and the resultant mixture was stirred for 4 hours, to synthesize the epoxy-modified silicone polymer (G). The siloxane unit in the silicone polymer (G) had a polymerization degree of 45.

EXPERIMENTAL EXAMPLE H

A solution of 80 g of trimethoxysilane (50.1% by mol of the total silane compounds), 62 g of dimethoxydimethylsilane (49.9% by mol of the total silane compounds) and 37 g of methanol as a synthetic solvent was incorporated with 1.4 g of maleic acid as a synthetic catalyst and 53 g of distilled water. The resultant mixture was stirred at 80° C. for 2 hours, to which 67 g of allylglycidyl ether and 0.2 g of chloroplatinate dissolved in isopropyl alcohol (2% by weight solution) were added, and the resultant mixture was stirred for 4 hours, to synthesize the epoxy-modified silicone polymer (H). The siloxane unit in the silicone polymer (H) had a polymerization degree of 31.

EXPERIMENTAL EXAMPLE J

A solution of 20 g of tetramethoxysilane (11.5% by mol of the total silane compounds), 60 g of trimethoxymethylsilane (38.4% by mol of the total silane compounds), 61 g of dimethoxymethylsilane (50.1% by mol of the total silane compounds) and 37 g of methanol as a synthetic solvent was incorporated with 1.3 g of maleic acid as a synthetic catalyst and 53 g of distilled water. The resultant mixture was stirred at 80° C. for 2 hours, to which 65 g of allylglycidyl ether and 0.2 g of chloroplatinate dissolved in isopropyl alcohol (2% by weight solution) were added, and the resultant mixture was stirred for 4 hours, to synthesize the epoxy-modified silicone polymer (J). The siloxane unit in the silicone polymer (J) had a polymerization degree of 120.

EXPERIMENTAL EXAMPLE K

A solution of 25 g of tetramethoxysilane (14.3% by mol of the total silane compounds), 75 g of trimethoxymethylsilane (48.0% by mol of the total silane compounds), 51 g of dimethoxymethylsilane (41.9% by mol of the total silane compounds) and 37 g of methanol as a synthetic solvent was incorporated with 1.4 g of maleic acid as a synthetic catalyst and 59 g of distilled water. The resultant mixture was stirred at 80° C. for 2 hours, to which 55 g of allylglycidyl ether and 0.2 g of chloroplatinate dissolved in isopropyl alcohol (2% by weight solution) were added, and the resultant mixture was stirred for 4 hours, to synthesize the epoxy-modified silicone polymer (K). The siloxane unit in the silicone polymer (K) had a polymerization degree of 45.

EXPERIMENTAL EXAMPLE I-1

A glass flask equipped with a stirrer, condenser and thermometer was charged with a mixture of the silicone polymer prepared in EXPERIMENTAL EXAMPLE A incorporated with silica powder (manufactured by Admatechs; SO-25R, average particle size: 0.5 μm) and methanol as a diluent solvent at 450 and 202 parts by weight with respect to 100 parts by weight of the solids in the silicone polymer, respectively. It was stirred at 80° C. for 1 hour and cooled to room temperature, to which tetrabromobisphenol A and 2-ethyl-4-methylimidazole were added at 78 and 3 parts by weight with respect to 100 parts by weight of the solids in the silicone polymer, respectively. The resultant mixture was stirred at room temperature for 1 hour, to prepare an inorganic filler solution (resin composition).

EXPERIMENTAL EXAMPLE I-2

An inorganic filler solution (resin composition) was prepared in the same manner as in EXPERIMENTAL EXAMPLE I-1, except that dose of the silica powder (manufactured by Admatechs; SO-25R, average particle size: 0.5 μm) and methanol were changed to 900 and 250 parts by weight with respect to 100 parts by weight of the solids in the silicone polymer prepared in EXPERIMENTAL EXAMPLE A, respectively.

EXPERIMENTAL EXAMPLE I-3

An inorganic filler solution (resin composition) was prepared in the same manner as in EXPERIMENTAL EXAMPLE I-1, except that dose of the silica powder (manufactured by Admatechs; SO-25R, average particle size: 0.5 μm) and methanol were changed to 1,300 and 490 parts by weight with respect to 100 parts by weight of the solids in the silicone polymer prepared in EXPERIMENTAL EXAMPLE A, respectively.

EXPERIMENTAL EXAMPLE I-4

An inorganic filler solution (resin composition) was prepared in the same manner as in EXPERIMENTAL EXAMPLE I-1, except that the silicone polymer prepared in EXPERIMENTAL EXAMPLE A was replaced by that prepared in EXPERIMENTAL EXAMPLE B.

EXPERIMENTAL EXAMPLE I-5

An inorganic filler solution (resin composition) was prepared in the same manner as in EXPERIMENTAL EXAMPLE I-4, except that dose of the silica powder (manufactured by Admatechs; SO-25R, average particle size: 0.5 μm) and methanol were changed to 900 and 250 parts by weight with respect to 100 parts by weight of the solids in the silicone polymer prepared in EXPERIMENTAL EXAMPLE B, respectively.

EXPERIMENTAL EXAMPLE I-6

An inorganic filler solution (resin composition) was prepared in the same manner as in EXPERIMENTAL EXAMPLE I-4, except that dose of the silica powder (manufactured by Admatechs; SO-25R, average particle size: 0.5 μm) and methanol were changed to 1,300 and 490 parts by weight with respect to 100 parts by weight of the solids in the silicone polymer prepared in EXPERIMENTAL EXAMPLE B, respectively.

EXPERIMENTAL EXAMPLE I-7

An inorganic filler solution (resin composition) was prepared in the same manner as in EXPERIMENTAL EXAMPLE I-1, except that the silicone polymer prepared in EXPERIMENTAL EXAMPLE A was replaced by that prepared in EXPERIMENTAL EXAMPLE C.

EXPERIMENTAL EXAMPLE I-8

An inorganic filler solution (resin composition) was prepared in the same manner as in EXPERIMENTAL EXAMPLE I-1, except that the silicone polymer prepared in EXPERIMENTAL EXAMPLE A was replaced by that prepared in EXPERIMENTAL EXAMPLE D.

EXPERIMENTAL EXAMPLE I-9

An inorganic filler solution (resin composition) was prepared in the same manner as in EXPERIMENTAL EXAMPLE I-1, except that 100 parts by weight of the solids in the silicone polymer prepared in EXPERIMENTAL EXAMPLE A was replaced by a mixture of 50 parts by weight of the solids in the silicone polymer prepared in EXPERIMENTAL EXAMPLE A and 50 parts by weight of the solids in the silicone polymer prepared in EXPERIMENTAL EXAMPLE B.

EXPERIMENTAL EXAMPLE I-10

An inorganic filler solution (resin composition) was prepared in the same manner as in EXPERIMENTAL EXAMPLE I-1, except that the silicone polymer prepared in EXPERIMENTAL EXAMPLE A was replaced by that prepared in EXPERIMENTAL EXAMPLE E and a dose of tetrabromobisphenol A was changed to 66 parts by weight with respect to 100 parts by weight of the solids in the silicone polymer, respectively.

EXPERIMENTAL EXAMPLE I-11

An inorganic filler solution (resin composition) was prepared in the same manner as in EXPERIMENTAL EXAMPLE I-1, except that the silicone polymer prepared in EXPERIMENTAL EXAMPLE A was replaced by that prepared in EXPERIMENTAL EXAMPLE F and a dose of tetrabromobisphenol A was changed to 104 parts by weight with respect to 100 parts by weight of the solids in the silicone polymer, respectively.

EXPERIMENTAL EXAMPLE I-12

An inorganic filler solution (resin composition) was prepared in the same manner as in EXPERIMENTAL EXAMPLE I-1, except that the silicone polymer prepared in EXPERIMENTAL EXAMPLE A was replaced by that prepared in EXPERIMENTAL EXAMPLE G and a dose rate of tetrabromobisphenol A was changed to 79 parts by weight with respect to 100 parts by weight of the solids in the silicone polymer, respectively.

EXPERIMENTAL EXAMPLE I-13

An inorganic filler solution (resin composition) was prepared in the same manner as in EXPERIMENTAL EXAMPLE I-1, except that the silicone polymer prepared in EXPERIMENTAL EXAMPLE A was replaced by that prepared in EXPERIMENTAL EXAMPLE H and a dose rate of tetrabromobisphenol A was changed to 76 parts by weight with respect to 100 parts by weight of the solids in the silicone polymer, respectively,

EXPERIMENTAL EXAMPLE I-14

An inorganic filler solution (resin composition) was prepared in the same manner as in EXPERIMENTAL EXAMPLE I-1, except that the silicone polymer prepared in EXPERIMENTAL EXAMPLE A was replaced by that prepared in EXPERIMENTAL EXAMPLE J and a dose rate of tetrabromobisphenol A was changed to 76 parts by weight with respect to 100 parts by weight of the solids in the silicone polymer, respectively.

EXPERIMENTAL EXAMPLE I-15

An inorganic filler solution (resin composition) was prepared in the same manner as in EXPERIMENTAL EXAMPLE I-1, except that the silicone polymer prepared in EXPERIMENTAL EXAMPLE A was replaced by that prepared in EXPERIMENTAL EXAMPLE K and a dose rate of tetrabromobisphenol A was changed to 63 parts by weight with respect to 100 parts by weight of the solids in the silicone polymer, respectively.

EXPERIMENTAL EXAMPLE I-16

An inorganic filler solution (resin composition) was prepared in the same manner as in EXPERIMENTAL EXAMPLE I-1, except that tetrabromobisphenol A as a setting agent was replaced by 33 parts by weight of bisphenol A.

EXPERIMENTAL EXAMPLE I-17

An inorganic filler solution (resin composition) was prepared in the same manner as in EXPERIMENTAL EXAMPLE I-1, except that 100 parts by weight of the solids in the silicone polymer prepared in EXPERIMENTAL EXAMPLE A was replaced by 100 parts by weight of an epoxy-modified silicone oil (manufactured by Shinetsu Chemical Co., Ltd; KF101) and a dose of methanol was changed to 219 parts by weight.

EXPERIMENTAL EXAMPLE I-18

An inorganic filler solution (resin composition) was prepared in the same manner as in EXPERIMENTAL EXAMPLE I-17, except that dose of the silica powder (manufactured by Admatechs SO-25R, average particle size: 0.5 μm) and methanol were changed to 900 and 267 parts by weight, respectively, with respect to 100 parts by weight of the epoxy-modified silicone oil (manufactured by Shinetsu Chemical Co., Ltd; KF101).

EXPERIMENTAL EXAMPLE I-19

An inorganic filler solution (resin composition) was prepared in the same manner as in EXPERIMENTAL EXAMPLE I-17, except that the epoxy-modified silicone oil (manufactured by Shinetsu Chemical Co., Ltd; KF101) was replaced by an epoxy-modified silicone oil (manufactured by Shinetsu Chemical Co., Ltd; KF105).

EXPERIMENTAL EXAMPLE I-20

An inorganic filler solution (resin composition) was prepared in the same manner as in EXPERIMENTAL EXAMPLE I-17, except that the epoxy-modified silicone oil (manufactured by Shinetsu Chemical Co., Ltd; KF101) was replaced by γ-glycidoxypropyltrimethoxysilane (manufactured by Nippon Unicar Co., Ltd.; A-187).

EXPERIMENTAL EXAMPLE I-21

An inorganic filler solution (resin composition) was prepared in the same manner as in EXPERIMENTAL EXAMPLE I-17, except that the epoxy-modified silicone oil (manufactured by Shinetsu Chemical Co., Ltd; KF101) was replaced by hydrochloride of N-β-[N-(vinylbenzyl)aminoethyl]-γ-aminopropyltrimethoxysilane (manufactured by Toray/Dow Corning/Silicone; SZ-6032).

EXPERIMENTAL EXAMPLE I-22

A glass flask equipped with a stirrer, condenser and thermometer was charged with a solution of 8 g of tetramethoxysilane, 32 g of dimethoxydimethylsilane, 17 g of dimethoxymethylsilane and 98 g of methanol as a synthetic solvent, to which 0.5 g of acetic acid as a synthetic catalyst and 16.2 g of distilled water were added. The mixture was stirred at 80° C. for 2 hours, to which 18.2 g of allylglycidyl ether and 0.04 g of chloroplatinate dissolved in isopropyl alcohol (2% by weight solution) were added, and the resultant mixture was stirred for 4 hours, to synthesize the epoxy-modified silicone polymer (L). The siloxane unit in the silicone polymer (L) had a polymerization degree of 18.

The silicone polymer (L) was incorporated with silica powder (manufactured by Admatechs; SO-25R, average particle size: 0.5 μm) and methanol as a diluent solvent at 450 and 202 parts by weight with respect to 100 parts by weight of the solids in the silicone polymer, respectively. The resultant mixture was stirred at 80° C. for 1 hour and cooled to room temperature, to which tetrabromobisphenol A and 2-ethyl-4-methylimidazole were added at 78 and 3 parts by weight with respect to 100 parts by weight of the solids in the silicone polymer, respectively. The resultant mixture was stirred at room temperature for 1 hour, to prepare an inorganic filler solution (resin composition).

(Evaluation Method 1)

Each of the inorganic filler solutions (resin compositions) prepared in EXPERIMENTAL EXAMPLES I-1 to I-22 was spread on a mold releasing film, and set at 170° C. for 2 hours, to prepare the film. Characteristics of each of the films (test pieces) prepared were evaluated by the following methods.

Its thermal expansion coefficient was measured by thermomechanical analysis (TMA; manufactured by MAC SCIENCE) in a tensile mode. Its elongation was measured for the 10 mm wide, 80 mm long, 50 to 100 μm thick film as the test piece by a tensile tester (manufactured by Shimadzu Corporation; Autograph AG-100C) under the conditions of chuck-chuck distance; 60 mm and tensile speed: 5 mm/minute.

"Dispersibility of the inorganic filler" of the resin composition was evaluated by the standards of "○": the inorganic filler was evenly mixed with the major agent, without attaching to the stirrer rod or flask walls, and "x": the inorganic filler was unevenly mixed with the major agent, while attaching to the stirrer rod or flask walls. The composition prepared in each EXPERIMENTAL EXAMPLE is given in Table 1, and the characteristics evaluation results of each composition in Table 2.

TABLE 1

Compositions Prepared in EXPERIMENTAL EXAMPLES I-1 to I-22

(unit: parts by weight)

| EXPERIMENTAL EXAMPLES | Silicone Polymer (or Substitute) | | Silica Powder [° F.] | Setting Agent | Remarks |
|---|---|---|---|---|---|
| I-1 | A | 100 | 450 | 78 | |
| I-2 | A | 100 | 900 | 78 | |
| I-3 | A | 100 | 1300 | 78 | |
| I-4 | B | 100 | 450 | 78 | |
| I-5 | B | 100 | 900 | 78 | |
| I-6 | B | 100 | 1300 | 78 | |
| I-7 | C | 100 | 450 | 78 | |
| I-8 | D | 100 | 450 | 78 | |
| I-9 | A/B | 50/50 | 450 | 78 | |
| I-10 | E | 100 | 450 | 66 | |
| I-11 | F | 100 | 450 | 104 | |
| I-12 | G | 100 | 450 | 79 | |
| I-13 | H | 100 | 450 | 76 | |
| I-14 | J | 100 | 450 | 76 | |
| I-15 | K | 100 | 450 | 63 | |
| I-16 | A | 100 | 450 | 33 | |
| I-17 | KF101 | 100 | 450 | 78 | COMP. EXAMPLE |
| I-18 | KF101 | 100 | 900 | 78 | COMP. EXAMPLE |
| I-19 | KF105 | 100 | 450 | 78 | COMP. EXAMPLE |
| I-20 | A-187 | 100 | 450 | 78 | COMP. EXAMPLE |
| I-21 | SZ-6032 | 100 | 450 | 78 | COMP. EXAMPLE |
| I-22 | L | 100 | 450 | 78 | COMP. EXAMPLE |

TABLE 2

Characteristics of the compositions prepared in EXPERIMENTAL EXAMPLES I-1 to I-22

| EXPERIMENTAL EXAMPLES | Thermal Exp. Coeff. (×$10^{-6}$/° C.) | Elongation [X](%) | Dispersibility of inorganic filler | [F. × X] | Remarks |
|---|---|---|---|---|---|
| I-1 | 22 | 3.1 | ○ | 1395 | |
| I-2 | 15 | 2.2 | ○ | 1980 | |
| I-3 | 10 | 1.2 | ○ | 1560 | |
| I-4 | 20 | 2.5 | ○ | 1125 | |
| I-5 | 13 | 1.6 | ○ | 1440 | |
| I-6 | 8 | 1.0 | ○ | 1300 | |
| I-7 | 30 | 2.2 | ○ | 990 | |
| I-8 | 35 | 2.0 | ○ | 900 | |
| I-9 | 19 | 3.2 | ○ | 1440 | |
| I-10 | 25 | 2.8 | ○ | 1260 | |
| I-11 | 30 | 2.5 | ○ | 1125 | |
| I-12 | 35 | 3.5 | ○ | 1575 | |
| I-13 | 25 | 2.5 | ○ | 1125 | |
| I-14 | 21 | 2.2 | ○ | 990 | |

TABLE 2-continued

| EXPERIMENTAL EXAMPLES | Characteristics of the compositions prepared in EXPERIMENTAL EXAMPLES I-1 to I-22 Thermal Exp. Coeff. ($\times 10^{-6}$/° C.) | Elongation [X](%) | Dispersibility of inorganic filler | [F. × X] | Remarks |
|---|---|---|---|---|---|
| I-15 | 24 | 2.8 | ○ | 1260 | |
| I-16 | 20 | 2.6 | ○ | 1170 | |
| I-17 | 60 | 1.3 | ○ | 585 | COMP. EXAMPLE |
| I-18 | — | — | X | — | COMP. EXAMPLE |
| I-19 | — | — | X | — | COMP. EXAMPLE |
| I-20 | 80 | 0.3 | ○ | 135 | COMP. EXAMPLE |
| I-21 | 75 | 0.5 | ○ | 225 | COMP. EXAMPLE |
| I-22 | 60 | 1.6 | ○ | 720 | COMP. EXAMPLE |

EXPERIMENTAL EXAMPLE II-1

A glass flask equipped with a stirrer, condenser and thermometer was charged with a mixture of the silicone polymer prepared in EXPERIMENTAL EXAMPLE A incorporated with silica powder (manufactured by Admatechs; SO-25R, average particle size: 0.5 μm) and methanol as a diluent solvent at 450 and 202 parts by weight with respect to 100 parts by weight of the solids in the silicone polymer, respectively. It was stirred at 80° C. for 1 hour and cooled to room temperature, to which tetrabromobisphenol A, 2-ethyl-4-methylimidazole and an elastomer modified with a silyl group at both terminals (manufactured by KANEKA CORPORATION; SAT200) were added at 78, 3 and 5 parts by weight with respect to 100 parts by weight of the solids in the silicone polymer, respectively. The resultant mixture was stirred at room temperature for 1 hour, to prepare an inorganic filler solution (resin composition).

EXPERIMENTAL EXAMPLE II-2

An inorganic filler solution (resin composition) was prepared in the same manner as in EXPERIMENTAL EXAMPLE II-1, except that a dose of the elastomer modified with a silyl group at both terminals (manufactured by KANEKA CORPORATION; SAT200) was changed to 10 parts by weight with respect to 100 parts by weight of the solids in the silicone polymer prepared in EXPERIMENTAL EXAMPLE A.

EXPERIMENTAL EXAMPLE II-3

An inorganic filler solution (resin composition) was prepared in the same manner as in EXPERIMENTAL EXAMPLE II-1, except that a dose of the elastomer modified with a silyl group at both terminals (manufactured by KANEKA CORPORATION; SAT200) was changed to 15 parts by weight with respect to 100 parts by weight of the solids in the silicone polymer prepared in EXPERIMENTAL EXAMPLE A.

EXPERIMENTAL EXAMPLE II-4

An inorganic filler solution (resin composition) was prepared in the same manner as in EXPERIMENTAL EXAMPLE II-1, except that dose of the silica powder (manufactured by Admatechs; SO-25R, average particle size: 0.5 μm) and is methanol were changed to 900 and 250 parts by weight with respect to 100 parts by weight of the solids in the silicone polymer prepared in EXPERIMENTAL EXAMPLE A, respectively.

EXPERIMENTAL EXAMPLE II-5

An inorganic filler solution (resin composition) was prepared in the same manner as in EXPERIMENTAL EXAMPLE II-4, except that a dose of the elastomer modified with a silyl group at both terminals (manufactured by KANEKA CORPORATION; SAT200) was changed to 10 parts by weight with respect to 100 parts by weight of the solids in the silicone polymer prepared in EXPERIMENTAL EXAMPLE A.

EXPERIMENTAL EXAMPLE II-6

An inorganic filler solution (resin composition) was prepared in the same manner as in EXPERIMENTAL EXAMPLE II-4, except that a dose of the elastomer modified with a silyl group at both terminals (manufactured by KANEKA CORPORATION; SAT200) was changed to 15 parts by weight with respect to 100 parts by weight of the solids in the silicone polymer prepared in EXPERIMENTAL EXAMPLE A.

EXPERIMENTAL EXAMPLE II-7

An inorganic filler solution (resin composition) was prepared in the same manner as in EXPERIMENTAL EXAMPLE II-1, except that dose of the silica powder (manufactured by Admatechs, SO-25R, average particle size: 0.5 μm) and methanol were changed to 1,300 and 490 parts by weight with respect to 100 parts by weight of the solids in the silicone polymer prepared in EXPERIMENTAL EXAMPLE A, respectively.

EXPERIMENTAL EXAMPLE II-8

An inorganic filler solution (resin composition) was prepared in the same manner as in EXPERIMENTAL EXAMPLE II-7, except that a dose rate of the elastomer modified with a silyl group at both terminals (manufactured by KANEKA CORPORATION; SAT200) was changed to 10 parts by weight with respect to 100 parts by weight of the solids in the silicone polymer prepared in EXPERIMENTAL EXAMPLE A.

EXPERIMENTAL EXAMPLE II-9

An inorganic filler solution (resin composition) was prepared in the same manner as in EXPERIMENTAL EXAMPLE II-7, except that a dose rate of the elastomer modified with a silyl group at both terminals (manufactured by KANEKA CORPORATION; SAT200) was changed to 15 parts by weight with respect to 100 parts by weight of the solids in the silicone polymer prepared in EXPERIMENTAL EXAMPLE A.

(Evaluation Method 2)

Each of the resin compositions prepared in EXPERIMENTAL EXAMPLES I-1 to I-3 and II-1 to II-9 was used to prepare the film in the same manner as described in Evaluation Method 1, and its thermal expansion coefficient, elongation and dispersibility of the inorganic filler were evaluated also in the same manner as described in Evaluation Method 1. Its breaking stress was measured for the 10 mm wide, 80 mm long, 50 to 100 μm thick film as the test piece by a tensile tester (manufactured by Shimadzu Corporation; Autograph AG-100C) under the conditions of chuck-chuck distance: 60 mm and tensile speed: 5 mm/minute. The composition prepared in each of EXPERIMENTAL EXAMPLES II is given in Table 3, and the characteristics evaluation results of each composition in Table 4.

TABLE 3

Compositions prepared in EXPERIMENTAL EXAMPLES II-1 to II-9

(unit: parts by weight)

| EXPERIMENTAL EXAMPLES | Silicone Polymer | | Elastomer Modified with Silyl Group at Both Terminals | Silica Powder | Setting Agent |
|---|---|---|---|---|---|
| II-1 | A | 100 | 5 | 450 | 78 |
| II-2 | A | 100 | 10 | 450 | 78 |
| II-3 | A | 100 | 15 | 450 | 78 |
| II-4 | A | 100 | 5 | 900 | 78 |
| II-5 | A | 100 | 10 | 900 | 78 |
| II-6 | A | 100 | 15 | 900 | 78 |
| II-7 | A | 100 | 5 | 1300 | 78 |
| II-8 | A | 100 | 10 | 1300 | 78 |
| II-9 | A | 100 | 15 | 1300 | 78 |

TABLE 4

Characteristics of the compositions prepared in EXPERIMENTAL EXAMPLES I-1 to I-3 and II-1 to II-9

| EXPERIMENTAL EXAMPLES | Thermal Exp. Coeff. ($\times 10^{-6}/°$ C.) | Elongation [X] (%) | Breaking Stress [Y] (MPa) | Dispersibility of Inorganic Filler | [F. × X] |
|---|---|---|---|---|---|
| I-1 | 22 | 3.1 | 18.6 | ○ | 1395 |
| I-2 | 15 | 2.2 | 9.5 | ○ | 1980 |
| I-3 | 10 | 1.2 | 2.5 | ○ | 1560 |
| II-1 | 25 | 3.9 | 23.0 | ○ | 1755 |
| II-2 | 28 | 4.2 | 26.0 | ○ | 1890 |
| II-3 | 31 | 4.6 | 37.3 | ○ | 2070 |
| II-4 | 17 | 2.8 | 12.3 | ○ | 2520 |
| II-5 | 19 | 3.0 | 15.1 | ○ | 2700 |
| II-6 | 21 | 3.3 | 20.0 | ○ | 2970 |
| II-7 | 13 | 1.5 | 3.4 | ○ | 1950 |
| II-8 | 15 | 1.6 | 4.1 | ○ | 2080 |
| II-9 | 18 | 1.8 | 5.3 | ○ | 2340 |

EXPERIMENTAL EXAMPLE III-1

A glass flask equipped with a stirrer, condenser and thermometer was charged with a mixture of the silicone polymer prepared in EXPERIMENTAL EXAMPLE A incorporated with an epoxy-modified silicone oil (manufactured by Shinetsu Chemical Co., Ltd's KF101), silica powder (Manufactured by Admatechs; SO-25R, average particle size: 0.5 μm) and methanol as a diluent solvent at 5, 900 and 250 parts by weight with respect to 95 parts by weight of the solids in the silicone polymer, respectively. It was stirred at 80° C. for 1 hour and cooled to room temperature, to which tetrabromobisphenol A and 2-ethyl-4-methylimidazole were added at 78 and 3 parts by weight, respectively. The resultant mixture was stirred at room temperature for 1 hour, to prepare an inorganic filler solution (resin composition).

EXPERIMENTAL EXAMPLE III-2

An inorganic filler solution (resin composition) was prepared in the same manner as in EXPERIMENTAL EXAMPLE III-1, except that dose of the epoxy-modified silicone oil (manufactured by Shinetsu Chemical Co., Ltd; KF101) silica powder (Manufactured by Admatechs; SO-25R, average particle size: 0.5 μm), methanol, tetrabromobisphenol A and 2-ethyl-4-methylimidazole were changed to 25; 900; 250; 78; and 3 parts by weight with respect to 75 parts by weight of the solids in the silicone polymer prepared in EXPERIMENTAL EXAMPLE A, respectively.

EXPERIMENTAL EXAMPLE III-3

An inorganic filler solution (resin composition) was prepared in the same manner as in EXPERIMENTAL EXAMPLE III-1, except that dose of the epoxy-modified silicone oil (manufactured by Shinetsu Chemical Co., Ltd; KF101), silica powder (Manufactured by Admatechs; SO-25R, average particle size: 0.5 μm), methanol, tetrabromobisphenol A and 2-ethyl-4-methylimidazole were changed to 50; 900; 250; 78; and 3 parts by weight with respect to 50 parts by weight of the solids in the silicone polymer prepared in EXPERIMENTAL EXAMPLE A, respectively.

EXPERIMENTAL EXAMPLE III-4

An inorganic filler solution (resin composition) was prepared in the same manner as in EXPERIMENTAL EXAMPLE III-1, except that dose of the epoxy-modified silicone oil (manufactured by Shinetsu Chemical Co., Ltd; KF101), silica powder (Manufactured by Admatechs; SO-25R, average particle size: 0.5 μm), methanol, tetrabromobisphenol A and 2-ethyl-4-methylimidazole were changed to 75; 900; 250; 78; and 3 parts by weight with respect to 25 parts by weight of the solids in the silicone polymer prepared in EXPERIMENTAL EXAMPLE A, respectively.

EXPERIMENTAL EXAMPLE III-5

An inorganic filler solution (resin composition) was prepared in the same manner as in EXPERIMENTAL EXAMPLE III-1, except that dose of the epoxy-modified silicone oil (manufactured by Shinetsu Chemical Co., Ltd; KF101), silica powder (Manufactured by Admatechs; SO-25R, average particle size: 0.5 μm), methanol, tetrabromobisphenol A and 2-ethyl-4-methylimidazole were changed to 95, 900, 250, 78 and 3 parts by weight with respect to 5 parts by weight of the solids in the silicone polymer prepared in EXPERIMENTAL EXAMPLE A, respectively.

EXPERIMENTAL EXAMPLE III-6

An inorganic filler solution (resin composition) was prepared in the same manner as in EXPERIMENTAL EXAMPLE III-1, except that dose of the epoxy-modified silicone oil (manufactured by Shinetsu Chemical Co., Ltd; KF101), silica powder (Manufactured by Admatechs; SO-25R, average particle size: 0.5 μm), methanol, tetrabromobisphenol A and 2-ethyl-4-methylimidazole were changed to 99, 900, 250, 78 and 3 parts by weight with respect to 1 part by weight of the solids in the silicone polymer prepared in EXPERIMENTAL EXAMPLE A, respectively.

EXPERIMENTAL EXAMPLE III-7

A glass flask equipped with a stirrer, condenser and thermometer was charged with a solution of 20 g of dimethoxydimethylsilane, 25 g of tetramethoxysilane and 105 g of methanol to which 0.60 g of acetic acid and 17.8 g of distilled water were added. The mixture was stirred at 50° C. for 8 hours, to synthesize a silicone polymer having a non-resin setting function.

An inorganic filler solution (resin composition) was prepared in the same manner as in EXPERIMENTAL EXAMPLE III-6, except that the silicone polymer prepared in EXPERIMENTAL EXAMPLE A was replaced by the silicone polymer having the non-resin setting function prepared above.

EXPERIMENTAL EXAMPLE III-8

An inorganic filler solution (resin composition) was prepared in the same manner as in EXPERIMENTAL EXAMPLE III-7, except that the silicone polymer having a non-resin setting function was replaced by γ-glycidoxypropyltrimethoxysilane (manufactured by Nippon Unicar Co., Ltd.; A-187).

EXPERIMENTAL EXAMPLE III-9

A glass flask equipped with a stirrer, condenser and thermometer was charged with 100 parts by weight of an epoxy-modified silicone oil, 900 parts by weight of silica powder (Manufactured by Admatechs; SO-25R, average particle size: 0.5 μm) and 250 parts by weight of methanol as a diluent solvent. The mixture was stirred at 80° C. for 1 hour and cooled to room temperature, to which tetrabromobisphenol A and 2-ethyl-4-methylimidazole were added at 78 and 3 parts by weight, respectively. The resultant mixture was stirred at room temperature for 1 hour, to prepare an inorganic filler solution (resin composition).

EXPERIMENTAL EXAMPLE III-10

An inorganic filler solution (resin composition) was prepared in the same manner as in EXPERIMENTAL EXAMPLE III-1, except that the epoxy-modified silicone oil (manufactured by Shinetsu Chemical Co., Ltd; KF101) was replaced by an epoxy-modified silicone oil (manufactured by Shinetsu Chemical Co., Ltd; X22-2000).

EXPERIMENTAL EXAMPLE III-11

An inorganic filler solution (resin composition) was prepared in the same manner as in EXPERIMENTAL EXAMPLE III-2, except that the epoxy-modified silicone oil (manufactured by Shinetsu Chemical Co., Ltd; KF101) was replaced by an epoxy-modified silicone oil (manufactured by Shinetsu Chemical Co., Ltd; X22-2000).

EXPERIMENTAL EXAMPLE III-12

An inorganic filler solution (resin composition) was prepared in the same manner as in EXPERIMENTAL EXAMPLE III-3, except that the epoxy-modified silicone oil (manufactured by Shinetsu Chemical Co., Ltd; KF101) was replaced by an epoxy-modified silicone oil (manufactured by Shinetsu Chemical Co., Ltd; X22-2000).

EXPERIMENTAL EXAMPLE III-13

An inorganic filler solution (resin composition) was prepared in the same manner as in EXPERIMENTAL EXAMPLE III-4, except that the epoxy-modified silicone oil (manufactured by Shinetsu Chemical Co., Ltd; KF101) was replaced by an epoxy-modified silicone oil (manufactured by Shinetsu Chemical Co., Ltd; X22-2000).

EXPERIMENTAL EXAMPLE III-14

An inorganic filler solution (resin composition) was prepared in the same manner as in EXPERIMENTAL EXAMPLE III-5, except that the epoxy-modified silicone oil (manufactured by Shinetsu Chemical Co., Ltd.; KF101) was replaced by an epoxy-modified silicone oil (manufactured by Shinetsu Chemical Co., Ltd.; X22-2000).

EXPERIMENTAL EXAMPLE III-15

An inorganic filler solution (resin composition) was prepared in the same manner as in EXPERIMENTAL EXAMPLE III-6, except that the epoxy-modified silicone oil (manufactured by Shinetsu Chemical Co., Ltd.; KF101) was replaced by an epoxy-modified silicone oil (manufactured by Shinetsu Chemical Co., Ltd.; X22-2000).

EXPERIMENTAL EXAMPLE III-16

An inorganic filler solution (resin composition) was prepared in the same manner as in EXPERIMENTAL EXAMPLE III-7, except that the epoxy-modified silicone oil (manufactured by Shin-Etsu Chemical's KF101) was replaced by an epoxy-modified silicone oil (manufactured by Shinetsu Chemical Co., Ltd.; X22-2000).

EXPERIMENTAL EXAMPLE III-17

An inorganic filler solution (resin composition) was prepared in the same manner as in EXPERIMENTAL EXAMPLE III-8, except that the epoxy-modified silicone oil (Shinetsu Chemical Co., Ltd.; KF101) was replaced by an epoxy-modified silicone oil (Manufactured by Shinetsu Chemical Co., Ltd.; X22-2000).

EXPERIMENTAL EXAMPLE III-18

An inorganic filler solution (resin composition) was prepared in the same manner as in EXPERIMENTAL EXAMPLE III-9, except that the epoxy-modified silicone oil (Manufactured by Shinetsu Chemical Co., Ltd.; KF101) was replaced by an epoxy-modified silicone oil (Manufactured by Shinetsu Chemical Co., Ltd.; X22-2000).

(Evaluation Method 3)

Each of the resin compositions prepared in EXPERIMENTAL EXAMPLES III-1 to III-18 was used to prepare the film in the same manner as described in Evaluation Method 1, and its thermal expansion coefficient, elongation, dispersibility of the inorganic filler and breaking stress were evaluated in the same manner as described in Evaluation Method 2. The composition prepared in each of EXPERIMENTAL EXAMPLES III-1 to III-18 is given in Table 5, and the characteristics evaluation results of each composition in Table 6.

TABLE 5

Compositions prepared in EXPERIMENTAL EXAMPLES III-1 to III-18

(unit: parts by weight)

| EXPERIMENTAL EXAMPLES | Silicone Polymer | | Epoxy-Modified Silicone Oil | | Silica Powder [F.] | Setting Agent | Remarks |
|---|---|---|---|---|---|---|---|
| III-1 | A | 95 | KF101 | 5 | 900 | 78 | |
| III-2 | A | 75 | KF101 | 25 | 900 | 78 | |
| III-3 | A | 50 | KF101 | 50 | 900 | 78 | |
| III-4 | A | 25 | KF101 | 75 | 900 | 78 | |
| III-5 | A | 5 | KF101 | 95 | 900 | 78 | |
| III-6 | A | 1 | KF101 | 99 | 900 | 78 | |
| III-7 | M | 1 | KF101 | 99 | 900 | 78 | |
| III-8 | N | 1 | KF101 | 99 | 900 | 78 | COMP. EXAMPLE |
| III-9 | — | 0 | KF101 | 100 | 900 | 78 | COMP. EXAMPLE |
| III-10 | A | 95 | X22-2000 | 5 | 900 | 78 | |
| III-11 | A | 75 | X22-2000 | 25 | 900 | 78 | |
| III-12 | A | 50 | X22-2000 | 50 | 900 | 78 | |
| III-13 | A | 25 | X22-2000 | 75 | 900 | 78 | |
| III-14 | A | 5 | X22-2000 | 95 | 900 | 78 | |
| III-15 | A | 1 | X22-2000 | 99 | 900 | 78 | |
| III-16 | M | 1 | X22-2000 | 99 | 900 | 78 | |
| III-17 | N | 1 | X22-2000 | 99 | 900 | 78 | COMP. EXAMPLE |
| III-18 | — | 0 | X22-2000 | 100 | 900 | 78 | COMP. EXAMPLE |

M: Silicone polymer having no resin-setting function
N: γ-Glycidoxypropyltrimethoxysilane

TABLE 6

Characteristics of the compositions prepared in EXPERIMENTAL EXAMPLES I-2 and III-1 to III-18

| EXPERIMENTAL EXAMPLES | Thermal Exp. Coeff. ($\times 10^{-6}$/° C.) | Elongation [X](%) | Breaking Stress (MPa) | Dispersibility of Inorganic Filler | [F. × X] (>800) | Remarks |
|---|---|---|---|---|---|---|
| I-2 | 15 | 2.2 | 9.5 | ○ | 1980 | |
| III-1 | 18 | 2.5 | 9.6 | ○ | 2250 | |
| III-2 | 25 | 2.8 | 9.8 | ○ | 2520 | |
| III-3 | 30 | 3.2 | 11.8 | ○ | 2880 | |
| III-4 | 38 | 3.7 | 12.7 | ○ | 3330 | |
| III-5 | 43 | 4.2 | 14.7 | ○ | 3780 | |
| III-6 | 45 | 3.5 | 14.4 | ○ | 3150 | |
| III-7 | 49 | 2.0 | 9.0 | ○ | 1800 | |
| III-8 | — | — | — | X | — | COMP. EXAMPLE |
| III-9 | — | — | — | X | — | COMP. EXAMPLE |
| III-10 | 17 | 2.3 | 9.6 | ○ | 2070 | |
| III-11 | 20 | 2.6 | 10.8 | ○ | 2340 | |
| III-12 | 24 | 2.8 | 11.3 | ○ | 2520 | |
| III-13 | 27 | 3.0 | 11.9 | ○ | 2700 | |
| III-14 | 29 | 3.5 | 12.3 | ○ | 3150 | |
| III-15 | 30 | 3.0 | 11.8 | ○ | 2700 | |
| III-16 | 35 | 1.7 | 8.5 | ○ | 1530 | |
| III-17 | — | — | — | X | — | COMP. EXAMPLE |
| III-18 | — | — | — | X | — | COMP. EXAMPLE |

EXPERIMENTAL EXAMPLE IV-1

A glass flask equipped with a stirrer, condenser and thermometer was charged with a mixture of the silicone polymer prepared in EXPERIMENTAL EXAMPLE A incorporated with silica powder (Manufactured by Admatechs; SO-25R, average particle size: 0.5 μm) and methanol as a diluent solvent at 450 and 202 parts by weight with respect to 100 parts by weight of the solids in the silicone polymer, respectively. It was stirred at 80° C. for 1 hour and cooled to room temperature, to which tetrabromobisphenol A, 2-ethyl-4-methylimidazole and m-phenylenediamine were added at 78, 3 and 1 part by weight with respect to 100 parts by weight of the solids in the silicone polymer, respectively. The resultant mixture was stirred at room temperature for 1 hour, to prepare an inorganic filler solution (resin composition).

EXPERIMENTAL EXAMPLE IV-2

An inorganic filler solution (resin composition) was prepared in the same manner as in EXPERIMENTAL EXAMPLE IV-1, except that dose of m-phenylenediamine was changed to 2 parts by weight with respect to 100 parts by weight of the solids in the silicone polymer.

EXPERIMENTAL EXAMPLE IV-3

An inorganic filler solution (resin composition) was prepared in the same manner as in EXPERIMENTAL EXAMPLE IV-1, except that m-phenylenediamine was replaced by 1 part by weight of 4,4'-diaminobenzanilide.

EXPERIMENTAL EXAMPLE IV-4

An inorganic filler solution (resin composition) was prepared in the same manner as in EXPERIMENTAL EXAMPLE IV-1, except that m-phenylenediamine was replaced by 1 part by weight of 3-amino-1-propanol.

EXPERIMENTAL EXAMPLE IV-5

An inorganic filler solution (resin composition) was prepared in the same manner as in EXPERIMENTAL EXAMPLE IV-1, except that m-phenylenediamine was replaced by 1 part by weight of dicyandiamide.

EXPERIMENTAL EXAMPLE IV-6

An inorganic filler solution (resin composition) was prepared in the same manner as in EXPERIMENTAL EXAMPLE IV-1, except that m-phenylenediamine was replaced by 1 part by weight of 4-aminophenol.

EXPERIMENTAL EXAMPLE IV-7

An inorganic filler solution (resin composition) was prepared in the same manner as in EXPERIMENTAL EXAMPLE IV-1, except that m-phenylenediamine was replaced by 1 part by weight of 4,4'-diamino-2,2'-dimethylbiphenyl.

EXPERIMENTAL EXAMPLE IV-8

An inorganic filler solution (resin composition) was prepared in the same manner as in EXPERIMENTAL EXAMPLE IV-1, except that dose of the silica powder (Manufactured by Admatechs; SO-25R, average particle size: 0.5 μm) and methanol were changed to 900 and 250 parts by weight with respect to 100 parts by weight of the solids in the silicone polymer prepared in EXPERIMENTAL EXAMPLE A, respectively.

EXPERIMENTAL EXAMPLE IV-9

An inorganic filler solution (resin composition) was prepared in the same manner as in EXPERIMENTAL EXAMPLE IV-8, except that m-phenylenediamine was replaced by 1 part by weight of 4,4'-diaminobenzanilide.

EXPERIMENTAL EXAMPLE IV-10

An inorganic filler solution (resin composition) was prepared in the same manner as in EXPERIMENTAL EXAMPLE IV-8, except that m-phenylenediamine was replaced by 1 part by weight of 3-amino-1-propanol.

EXPERIMENTAL EXAMPLE IV-11

An inorganic filler solution (resin composition) was prepared in the same manner as in EXPERIMENTAL EXAMPLE IV-8, except that m-phenylenediamine was replaced by 1 part by weight of dicyandiamide.

EXPERIMENTAL EXAMPLE IV-12

An inorganic filler solution (resin composition) was prepared in the same manner as in EXPERIMENTAL EXAMPLE IV-8, except that m-phenylenediamine was replaced by 1 part by weight of 4-aminophenol.

EXPERIMENTAL EXAMPLE IV-13

An inorganic filler solution (resin composition) was prepared in the same manner as in EXPERIMENTAL EXAMPLE IV-8, except that m-phenylenediamine was replaced by 1 part by weight of 4,4'-diamino 2,2' dimethylbiphenyl.

EXPERIMENTAL EXAMPLE IV-14

An inorganic filler solution (resin composition) was prepared in the same manner as in EXPERIMENTAL EXAMPLE IV-1, except that dose of the silica powder (Manufactured by Admatechs; SO-25R, average particle size: 0.5 μm) and methanol were changed to 1,300 and 250 parts by weight with respect to 100 parts by weight of the solids in the silicone polymer prepared in EXPERIMENTAL EXAMPLE A, respectively.

EXPERIMENTAL EXAMPLE IV-15

An inorganic filler solution (resin composition) was prepared in the same manner as in EXPERIMENTAL EXAMPLE IV-14, except that m-phenylenediamine was replaced by 1 part by weight of 4,4'-diaminobenzanilide.

EXPERIMENTAL EXAMPLE IV-16

An inorganic filler solution (resin composition) was prepared in the same manner as in EXPERIMENTAL EXAMPLE IV-14, except that m-phenylenediamine was replaced by 1 part by weight of 3-amino-1-propanol.

EXPERIMENTAL EXAMPLE IV-17

An inorganic tiller solution (resin composition) was prepared in the same manner as in EXPERIMENTAL EXAMPLE IV-14, except that m-phenylenediamine was replaced by 1 part by weight of dicyandiamide.

EXPERIMENTAL EXAMPLE IV-18

An inorganic filler solution (resin composition) was prepared in the same manner as in EXPERIMENTAL EXAMPLE IV-14, except that m-phenylenediamine was replaced by 1 part by weight of 4-aminophenol.

EXPERIMENTAL EXAMPLE IV-19

An inorganic filler solution (resin composition) was prepared in the same manner as in EXPERIMENTAL EXAMPLE IV-14, except that m-phenylenediamine was replaced by 1 part by weight of 4,4'-diamino-2,2'-dimethylbiphenyl.

(Evaluation Method 4)

Each of the resin compositions prepared in EXPERIMENTAL EXAMPLES I-1 to I-3 and EXPERIMENTAL EXAMPLES IV-1 to IV-18 was used to prepare the film in the same manner as described in Evaluation Method 1, and its thermal expansion coefficient, elongation and dispersibility of the inorganic filler were evaluated in the same manner also as described in Evaluation Method 1. Its peel strength was determined for the test piece, prepared by pressing a 18 μm thick copper foil coated with the inorganic filler solution (resin composition) under heating at 175° C. and 2.45 MPa and providing the resin layer with 10 mm wide lines by etching, where the strength in the direction perpendicular to the layer was measured by a tensile tester (Shimadzu Corporation; Autograph AG-100C) at a tensile speed of 5 mm/minute. The composition prepared in each of EXPERIMENTAL EXAMPLES IV-1 to IV-19 is given in Table 7, and the characteristics evaluation results of each composition in Table 8.

TABLE 7

Compositions prepared in EXPERIMENTAL EXAMPLES IV-1 to IV-19

(unit: parts by weight)

| EXPERIMENTAL EXAMPLES | Silicone Polymer | | Amine Compound: Compound | Amine Compound: Dose Rate | Silica Powder [F.] | Setting Agent |
|---|---|---|---|---|---|---|
| IV-1 | A | 100 | a | 1 | 450 | 78 |
| IV-2 | A | 100 | a | 2 | 450 | 78 |
| IV-3 | A | 100 | b | 1 | 450 | 78 |
| IV-4 | A | 100 | c | 1 | 450 | 78 |
| IV-5 | A | 100 | d | 1 | 450 | 78 |
| IV-6 | A | 100 | e | 1 | 450 | 78 |
| IV-7 | A | 100 | f | 1 | 450 | 78 |
| IV-8 | A | 100 | a | 1 | 900 | 78 |
| IV-9 | A | 100 | b | 1 | 900 | 78 |
| IV-10 | A | 100 | c | 1 | 900 | 78 |
| IV-11 | A | 100 | d | 1 | 900 | 78 |
| IV-12 | A | 100 | e | 1 | 900 | 78 |
| IV-13 | A | 100 | f | 1 | 900 | 78 |
| IV-14 | A | 100 | a | 1 | 1300 | 78 |
| IV-15 | A | 100 | b | 1 | 1300 | 78 |
| IV-16 | A | 100 | c | 1 | 1300 | 78 |
| IV-17 | A | 100 | d | 1 | 1300 | 78 |
| IV-18 | A | 100 | e | 1 | 1300 | 78 |
| IV-19 | A | 100 | f | 1 | 1300 | 78 |

Amine Compounds:
a: m-phenylenediamine,
b: 4,4'-Diaminobenzanilide,
c: 3-Amino-1-propanol,
d: Dicyandiamide
e: 4-Aminophenol,
f: 4,4'-Diamino-2,2'-dimethylbiphenyl

TABLE 8

Characteristics of the compositions prepared in EXPERIMENTAL EXAMPLES I-1 to I-3 and IV-1 to IV-19

| EXPERIMENTAL EXAMPLES | Thermal Exp. Coeff. ($\times 10^{-6}$/° C.) | Elongation [X] (%) | Peel Strength [z] (kN/m) | Dispersibility of Inorganic Filler | [F. × X] (>800) |
|---|---|---|---|---|---|
| I-1 | 22 | 3.1 | 0.73 | ○ | 1395 |
| I-2 | 15 | 2.2 | 0.50 | ○ | 1980 |
| I-3 | 10 | 1.2 | 0.25 | ○ | 1560 |
| IV-1 | 22 | 2.9 | 2.85 | ○ | 1305 |
| IV-2 | 20 | 2.7 | 0.89 | ○ | 1170 |
| IV-3 | 22 | 2.9 | 0.85 | ○ | 1305 |
| IV-4 | 23 | 3.1 | 0.84 | ○ | 1395 |
| IV-5 | 23 | 3.1 | 0.84 | ○ | 1395 |
| IV-6 | 22 | 3.0 | 0.83 | ○ | 1350 |
| IV-7 | 22 | 3.0 | 0.79 | ○ | 1350 |
| IV-8 | 15 | 2.1 | 0.58 | ○ | 1890 |
| IV-9 | 15 | 2.1 | 0.58 | ○ | 1890 |
| IV-10 | 16 | 2.2 | 0.57 | ○ | 1980 |
| IV-11 | 16 | 2.2 | 0.57 | ○ | 1980 |
| IV-12 | 15 | 2.1 | 0.56 | ○ | 1890 |
| IV-13 | 15 | 2.1 | 0.54 | ○ | 1890 |
| IV-14 | 10 | 1.1 | 0.30 | ○ | 1430 |
| IV-15 | 10 | 1.1 | 0.30 | ○ | 1430 |
| IV-16 | 11 | 1.2 | 0.29 | ○ | 1560 |
| IV-17 | 11 | 1.2 | 0.29 | ○ | 1560 |
| IV-18 | 10 | 1.1 | 0.28 | ○ | 1430 |
| IV-19 | 10 | 1.1 | 0.28 | ○ | 1430 |

EXPERIMENTAL EXAMPLE V-1

A glass flask equipped with a stirrer, condenser and thermometer was charged with a mixture of the silicone polymer prepared in EXPERIMENTAL EXAMPLE A incorporated with silica powder (Manufactured by Admatechs; SO-25R, average particle size: 0.5 μm) and methanol as a diluent solvent at 900 and 250 parts by weight with respect to 100 parts by weight of the solids in the silicone polymer, respectively. It was stirred at 80° C. for 1 hour and cooled to room temperature, to which tetrabromobisphenol A, 2-ethyl-4-methylimidazole, an elastomer modified with a silyl group at both terminals (manufactured by KANEKA CORPORATION; SAT200) and m-phenylenediamine were added at 78; 3; 5; and 1 part by weight with respect to 100 parts by weight of the solids in the silicone polymer, respectively. The resultant mixture was stirred at room temperature for 1 hour, to prepare an inorganic filler solution (resin composition).

EXPERIMENTAL EXAMPLE V-2

A glass flask equipped with a stirrer, condenser and thermometer was charged with a mixture of the silicone polymer prepared in EXPERIMENTAL EXAMPLE A incorporated with an epoxy-modified silicone oil (Manufactured by Shinetsu Chemical Co., Ltd.; KF101), silica powder (Manufactured by Admatechs; SO-25R, average particle size: 0.5 μm) and methanol as a diluent solvent at 5, 900 and 250 parts by weight with respect to 95 parts by weight of the solids in the silicone polymer, respectively. It was stirred at 80° C. for 1 hour and cooled to room temperature, to which tetrabromobisphenol A, 2-ethyl-4-methylimidazole, an elastomer modified with a silyl group at both terminals (manufactured by KANEKA CORPORATION; SAT200) and m-phenylenediamine were added at 78, 3, 5 and 1 part by weight with respect to 100 parts by weight of the solids in the silicone polymer, respectively. The resultant mixture was stirred at room temperature for 1 hour, to prepare an inorganic filler solution (resin composition).

EXPERIMENTAL EXAMPLE V-3

An inorganic filler solution (resin composition) was prepared in the same manner as in EXPERIMENTAL EXAMPLE V-2, except that dose of the epoxy-modified silicone oil (Manufactured by Shinetsu Chemical Co., Ltd.; KF101), silica powder (Manufactured by Admatechs; SO-25R, average particle size: 0.5 μm), methanol, tetrabromobisphenol A, 2-ethyl-4-methylimidazole, elastomer modified with a silyl group at both terminals (manufactured by KANEKA CORPORATION; SAT200) and m-phenylenediamine were changed to 95; 900; 250; 78; 3; 5; and 1 part by weight with respect to 5 parts by weight of the solids in the silicone polymer, respectively.

EXPERIMENTAL EXAMPLE V-4

An inorganic filler solution (resin composition) was prepared in the same manner as in EXPERIMENTAL EXAMPLE V-2, except that dose of the epoxy-modified silicone oil (Manufactured by Shinetsu Chemical Co., Ltd.; KF101), silica powder (Manufactured by Admatechs; SO-25R, average particle size: 0.5 μm), methanol, tetrabromobisphenol A, 2-ethyl-4-methylimidazole, elastomer modified with a silyl group at both terminals (manufactured by KANEKA CORPORATION; SAT200) and m-phenylenediamine were changed to 99; 900; 250; 78; 3; 5; and 1 part by weight per part by weight of the solids in the silicone polymer, respectively.

EXPERIMENTAL EXAMPLE V-5

A glass flask equipped with a stirrer, condenser and thermometer was charged with a solution of 20 g of dimethoxydimethylsilane, 25 g of tetramethoxysilane and 105 g of methanol, to which 0.60 g of acetic acid and 17.8 g of distilled water were added. The mixture was stirred at 50° C. for 8 hours, to synthesize a silicone polymer having a non-resin setting function.

An inorganic filler solution (resin composition) was prepared in the same manner as in EXPERIMENTAL EXAMPLE V-4, except that the silicone polymer prepared in EXPERIMENTAL EXAMPLE A was replaced by the silicone polymer having the non-resin setting function prepared above.

EXPERIMENTAL EXAMPLE V-6

An inorganic filler solution (resin composition) was prepared in the same manner as in EXPERIMENTAL EXAMPLE V-4, except that the silicone polymer having a non-resin setting function was replaced by γ-glycidoxypropyltrimethoxysilane (manufactured by Nippon Unicar Co., Ltd.; A-187).

EXPERIMENTAL EXAMPLE V-7

An inorganic filler solution (resin composition) was prepared in the same manner as in EXPERIMENTAL EXAMPLE V-1, except that the silicone polymer prepared in EXPERIMENTAL EXAMPLE A was replaced 100 parts by weight of an epoxy-modified silicone oil (Manufactured by Shinetsu Chemical Co., Ltd.; KF101).

EXPERIMENTAL EXAMPLE V-8

An inorganic filler solution (resin composition) was prepared in the same manner as in EXPERIMENTAL EXAMPLE V-1, except that a dose rate of the silica powder (Manufactured by Admatechs; SO-25R, average particle size: 0.5 μm) was changed from 900 to 1,300 parts by weight.

EXPERIMENTAL EXAMPLE V-9

An inorganic filler solution (resin composition) was prepared in the same manner as in EXPERIMENTAL EXAMPLE V-2, except that a dose rate of the silica powder (Manufactured by Admatechs; SO-25R, average particle size: 0.5 μm) was changed from 900 to 1,300 parts by weight.

EXPERIMENTAL EXAMPLE V-10

An inorganic filler solution (resin composition) was prepared in the same manner as in EXPERIMENTAL EXAMPLE V-3, except that a dose rate of the silica powder (Manufactured by Admatechs; SO-25R, average particle size: 0.5 μm) was changed from 900 to 1,300 parts by weight.

EXPERIMENTAL EXAMPLE V-11

An inorganic filler solution (resin composition) was prepared in the same manner as in EXPERIMENTAL EXAMPLE V-4, except that a dose rate of the silica powder (Manufactured by Admatechs; SO-25R, average particle size: 0.5 μm) was changed from 900 to 1,300 parts by weight.

EXPERIMENTAL EXAMPLE V-12

An inorganic filler solution (resin composition) was prepared in the same manner as in EXPERIMENTAL EXAMPLE V-5, except that a dose rate of the silica powder (Manufactured by Admatechs; SO-25R, average particle size: 0.5 μm) was changed from 900 to 1,300 parts by weight.

EXPERIMENTAL EXAMPLE V-13

An inorganic filler solution (resin composition) was prepared in the same manner as in EXPERIMENTAL EXAMPLE V-6, except that a dose rate of the silica powder (Manufactured by Admatechs; SO-25R, average particle size: 0.5 μm) was changed from 900 to 1,300 parts by weight

EXPERIMENTAL EXAMPLE V-14

An inorganic filler solution (resin composition) was prepared in the same manner as in EXPERIMENTAL EXAMPLE V-7, except that a dose rate of the silica powder (Manufactured by Admatechs; SO-25R, average particle size: 0.5 μm) was changed from 900 to 1,300 parts by weight.

(Evaluation Method 5)

Each of the resin compositions prepared in EXPERIMENTAL EXAMPLES V-1 to V-14 was used to prepare the film in the same manner as described in Evaluation Method 1, and its thermal expansion coefficient, elongation, dispersibility of the inorganic filler and breaking stress were evaluated in the same manner as described in Evaluation Method 2. Its peel strength was measured evaluated in the same manner as described in Evaluation Method 4. The composition prepared in each of EXPERIMENTAL EXAMPLES V-1 to V-14 is given in Table 9, and the characteristics evaluation results of each composition in Table 10.

TABLE 9

Compositions prepared in EXPERIMENTAL EXAMPLES V-1 to V-14

(unit: parts by weight)

| EXPERIMENTAL EXAMPLES | Silicone Polymer | | Epoxy-Modified Silicone Oil | | Silyl-Modified Elastomer | m-Phenylene-diamine | Silica Powder [F.] | Tetrabromo-bisphenol A |
|---|---|---|---|---|---|---|---|---|
| V-1 | A | 100 | — | 0 | 5 | 1 | 900 | 78 |
| V-2 | A | 95 | KF-101 | 5 | 5 | 1 | 900 | 78 |
| V-3 | A | 5 | KF-101 | 95 | 5 | 1 | 900 | 78 |
| V-4 | A | 1 | KF-101 | 99 | 5 | 1 | 900 | 78 |
| V-5 | M | 1 | KF-101 | 99 | 5 | 1 | 900 | 78 |
| V-6 | N | 1 | KF-101 | 99 | 5 | 1 | 900 | 78 |
| V-7 | — | 0 | KF-101 | 100 | 5 | 1 | 900 | 78 |
| V-8 | A | 100 | — | 0 | 5 | 1 | 1300 | 78 |
| V-9 | A | 95 | KF-101 | 5 | 5 | 1 | 1300 | 78 |

TABLE 9-continued

Compositions prepared in EXPERIMENTAL EXAMPLES V-1 to V-14

(unit: parts by weight)

| EXPERIMENTAL EXAMPLES | Silicone Polymer | | Epoxy-Modified Silicone Oil | | Silyl-Modified Elastomer | m-Phenylene-diamine | Silica Powder [F.] | Tetrabromo-bisphenol A |
|---|---|---|---|---|---|---|---|---|
| V-10 | A | 5 | KF-101 | 95 | 5 | 1 | 1300 | 78 |
| V-11 | A | 1 | KF-101 | 99 | 5 | 1 | 1300 | 78 |
| V-12 | M | 1 | KF-101 | 99 | 5 | 1 | 1300 | 78 |
| V-13 | N | 1 | KF-101 | 99 | 5 | 1 | 1300 | 78 |
| V-14 | — | 0 | KF-101 | 100 | 5 | 1 | 1300 | 78 |

M: Silicone polymer having no resin-setting function
N: γ-Glycidoxypropyltrimethoxysilane
Elastomer modified with silyl group at both terminals: Kaneka's SAT200
Silica powder: Admatechs' SO-25R

TABLE 10

Characteristics of the compositions prepared in EXPERIMENTAL EXAMPLES V-1 to V-14

| EXPERIMENTAL EXAMPLES | Thermal Exp. Coeff. ($\times 10^{-6}$/° C.) | Elongation (%) [X] | Breaking Stress (MPa) | Peel Strength (kN/m) | Dispersibility of Inorganic Filler | [F. × X] (>800) | Remarks |
|---|---|---|---|---|---|---|---|
| V-1 | 22 | 3.1 | 18.6 | 0.60 | ○ | 2790 | |
| V-2 | 25 | 3.4 | 18.7 | 0.62 | ○ | 3060 | |
| V-3 | 48 | 5.1 | 23.7 | 0.65 | ○ | 4590 | |
| V-4 | 49 | 4.4 | 23.4 | 0.67 | ○ | 3960 | |
| V-5 | 49 | 2.9 | 18.0 | 0.65 | ○ | 2610 | |
| V-6 | — | — | — | — | X | — | COMP. EXAMPLE |
| V-7 | — | — | — | — | X | — | COMP. EXAMPLE |
| V-8 | 13 | 1.5 | 3.4 | 0.32 | ○ | 1980 | |
| V-9 | 14 | 1.6 | 3.6 | 0.34 | ○ | 2080 | |
| V-10 | 18 | 2.7 | 5.0 | 0.37 | ○ | 3510 | |
| V-11 | 19 | 2.5 | 4.8 | 0.40 | ○ | 3250 | |
| V-12 | 20 | 1.5 | 3.2 | 0.37 | ○ | 1950 | |
| V-13 | — | — | — | — | X | — | COMP. EXAMPLE |
| V-14 | — | — | — | — | X | — | COMP. EXAMPLE |

These results indicate that the resin composition of the present invention can include a high proportion of an inorganic filler without deteriorating its dispersibility to have a low thermal expansion coefficient. Moreover, it has a high elongation, in spite of the high proportion of an inorganic filler it contains, to realize low stress. Still more, the resin composition of the present invention has a low thermal expansion coefficient and sufficient breaking stress after it has been set, which allows it to be handled very easily, and incorporation of an elastomer modified with a silyl group at both terminals or epoxy-modified silicone oil further improves its elongation and breaking stress, as indicated by the results of EXPERIMENTAL EXAMPLES II-1 to II-9, III-1 to III-18 and V-1 to V-14. Incorporation of an agent for reinforcing adhesion makes the resin composition more adhesive to a metallic foil, as indicated by the results of EXPERIMENTAL EXAMPLES IV-1 to IV-19 and V-1 to V14.

The resin composition prepared in each of EXPERIMENTAL EXAMPLES was spread on a 18 μm thick copper foil, prepared by electrolysis to have a roughened surface, by a knife coater to form an insulation resin layer having a thickness of 50 μm after it was dried. The coated foil was dried at 140° C. for 3 minutes to have the semi-set insulation resin layer. These foils were placed one on another in such a way that the insulation resin layers came into contact with each other, and pressed under heating at 170° C. and 2 MPa for 1 hour, to prepare the insulation film coated with metallic film on each side.

The resin composition prepared in each of EXPERIMENTAL EXAMPLES was also spread on a 75 μm thick polyethylene terephthalate film treated with a mold releasing agent, and dried at 140° C. for 3 minutes into the semi-set resin layer having a thickness of 80 μm. The resultant resin film was placed on each side of a glass cloth/epoxy resin prepareg (manufactured by Hitachi Chemical Co., Ltd.; GE-67N; thickness 0.1 mm, size 500 by 600 mm), then coated with a copper foil prepared by electrolysis, and pressed under heating at 170° C. and 2 MPa for 1 hour, to prepare the metal-clad plate.

A core material, composed of a 0.2 mm thick laminate lined with a 18 μm thick copper foil on each side (manufactured by Hitachi Chemical Co., Ltd.; MCL-E-67) which was etched to have a circuit, was coated with the metallic foil provided with the insulation material produced above on each side in such a way that the insulation materials came into contact with the internal circuit, and pressed under heating at 170° C. and 2 MPa for 90 minutes, to prepare the multi-layered metal-clad laminate.

The multi-layered metal-clad laminate was etched to have a circuit, to prepare the multi-layered printed-wiring board.

The insulation film coated with the metallic film on each side, metal-clad plate, multi-layered metal-clad laminate and multi-layered printed-wiring board thus produced were evaluated for their flame retardancy and heat resistance. The flame retardancy was evaluated by the vertical burn test in accordance with UL94 for the test piece etched on the entire surface. The heat resistance was evaluated for the test piece cut into a size of 50 by 50 mm, which was immersed in molten solder kept at 260 and 288° C. for 20 seconds, to observe measling or blister. Each of the insulation film coated with the metallic film on each side, multi-layered metal-clad laminate and multi-layered printed-wiring board of the present invention exhibited good flame retardancy and heat resistance.

It is to be understood by those skilled in the art that the above EXPERIMENTAL EXAMPLES illustrate best modes for carrying out the invention, and alterations and modifications may be made without departing from the spirit and scope of the invention.

What is claimed is:

1. A thermosetting resin composition, which has a thermal expansion coefficient after having been set of $30\times10^{-6}$/° C. or less, and comprises: a thermosetting resin having a resin-setting functional group; a setting agent; an inorganic filler, wherein the inorganic filler is incorporated at 100 parts by weight or more with respect to 100 parts by weight of the thermosetting resin; and an amine compound having two or more reactive functional groups per molecule;

wherein the thermosetting resin is a thermosetting silicone polymer prepared by a process comprising:

(1) subjecting a silane composition to hydrolysis and polycondensation, wherein said silane composition comprises: 35 to 100 mole percent of at least one silane compound of general formula (I)

$$R'_m(H)_kSiX_{4-(m+k)} \quad (I)$$

wherein X is a hydrolyzable and polycondensable group, R' is a non-reactive group, the subscript k is 1 or 2, the subscript m is 0 or 1 and (m+k) is 1 or 2; and 65 to 0 mole percent of at least one silane compound of general formula (II)

$$R'_nSiX_{4-n} \quad (II)$$

wherein X and R' are as defined above and the subscript n is 0, 1 or 2; wherein the at least one silane compound of general formula (I) and the at least one silane compound of general formula (II) account for 100 mole percent of silane compounds of the silane composition; and (2) subjecting the resultant product to a hydrosilylation reaction with a hydrosilylation agent having a resin-setting functional group.

2. The thermosetting resin composition of claim 1, which has a thermal expansion coefficient after having been set of $15\times10^{-6}$/° C. or less.

3. The thermosetting resin composition of claim 1, which comprises at least one of (a) the setting agent in a ratio of 0.2 to 1.5 equivalents per equivalent of resin-setting functional group in the thermosetting resin, and (b) the inorganic filler in a weight ratio of 100 to 2,000 parts per 100 parts of thermosetting resin.

4. A resin film, wherein the resin film comprises the thermosetting resin composition of claim 1.

5. A metallic foil provided with an insulation material, wherein the metallic foil comprises on one side thereof a layer comprising the thermosetting resin composition of claim 1.

6. An assembly comprising an insulating film provided with a metallic foil on each side thereof, wherein the assembly comprises two sheets of the metallic foil of claim 5 placed on each other in such a way that the layers comprising the thermosetting resin composition are in contact with each other.

7. An insulating film provided with a metallic foil on each side thereof, wherein the insulating film comprises a layer comprising the thermosetting resin composition of claim 1 and wherein the metallic foil comprises a copper foil.

8. A metal-clad laminate comprising a core material coated with an insulating resin layer on at least one side thereof, wherein the insulating resin layer comprises the thermosetting resin composition of claim 1 and is coated with a metallic layer.

9. A multi-layer metal-clad laminate wherein a resin layer is provided on a circuit of an internal circuit board, and wherein the resin layer comprises the thermosetting resin composition of claim 1 and is coated with a metallic layer.

10. A multi-layer printed wiring board, wherein the wiring board has a resin layer on a circuit of an internal circuit board and wherein the resin layer comprises the thermosetting resin composition of claim 1 and is provided with a circuit pattern.

11. A thermosetting resin composition, which, after having been set, has a thermal expansion coefficient of $50\times10^{-6}$/° C. or less and at least one of(a) an elongation of 1.0% or more as determined by a tensile test; (b) a breaking stress of 2 MPa or more; and (c) a peel strength of 0.5 kN/m or more with an electroconductive layer to which it is bonded, and comprises: a thermosetting resin having a resin-setting functional group; a setting agent; and an inorganic filler, wherein the inorganic filler is incorporated at 100 parts by weight or more with respect to 100 parts by weight of the thermosetting resin; and an amine compound having two or more reactive functional groups per molecule;

wherein the thermosetting resin is a thermosetting silicone polymer prepared by a process comprising:

(1) subjecting a silane composition to hydrolysis and polycondensation, wherein said silane composition comprises: 35 to 100 mole percent of at least one silane compound of general formula (I)

$$R'_m(H)_kSiX_{4-(m+k)} \quad (I)$$

wherein X is a hydrolyzable and polycondensable group, R' is a non-reactive group, the subscript k is 1 or 2, the subscript m is 0 or 1 and (m+k) is 1 or 2; and 65 to 0 mole percent of at least one silane compound of general formula (II)

$$R'_nSiX_{4-n} \quad (II)$$

wherein X and R' are as defined above and the subscript n is 0, 1 or 2; wherein the at least one silane compound of general formula (I) and the at least one silane compound of general formula (II) account for 100 mole percent of silane compounds of the silane composition; and (2) subjecting the resultant product to a hydrosilylation reaction with a hydrosilylation agent having a resin-setting functional group.

12. The thermosetting resin composition of claim 11, which comprises at least one of (a) the setting agent in a ratio of 0.2 to 1.5 equivalents per equivalent of resin-setting functional group in the thermosetting resin, and (b) the inorganic filler in a weight ratio of 100 to 2,000 parts per 100 parts of thermosetting resin.

13. A resin film, wherein the resin film comprises the thermosetting resin composition of claim 11.

14. A metallic foil provided with an insulation material, wherein the metallic foil comprises on one side thereof a layer comprising the thermosetting resin composition of claim 11.

15. An assembly comprising an insulating film provided with a metallic foil on each side thereof, wherein the assembly comprises two sheets of the metallic foil of claim 14 placed on each other in such a way that the layers comprising the thermosetting resin composition are in contact with each other.

16. An insulating film provided with a metallic foil on each side thereof, wherein the insulating film comprises a layer comprising the thermosetting resin composition of claim 11 and wherein the metallic foil comprises a copper foil.

17. A metal-clad laminate comprising a core material coated with an insulating resin layer on at least one side thereof, wherein the insulating resin layer comprises the thermosetting resin composition of claim 11 and is coated with a metallic layer.

18. A multi-layer metal-clad laminate wherein a resin layer is provided on a circuit of an internal circuit board, and wherein the resin layer comprises the thermo setting resin composition of claim 11 and is coated with a metallic layer.

19. A multi-layer printed wiring board, wherein the wiring board has a resin layer on a circuit of an internal circuit board and wherein the resin layer comprises the thermosetting resin composition of claim 11 and is provided with a circuit pattern.

20. A thermosetting resin composition, which, after having been set, has a peel strength with an electroconductive layer to which it is bonded of at least 0.25 kN/m, and comprises: a thermosetting resin having a resin-setting functional group; a setting agent in a ratio of 0.2 to 1.5 equivalents per equivalent of the resin-setting functional group in the thermosetting resin; an inorganic filler, wherein the inorganic filler is incorporated at 100 parts by weight or more with respect to 100 parts by weight of the thermosetting resin; and an amine compound having two or more reactive functional groups per molecule;

wherein the thermosetting resin is a thermosetting silicone polymer prepared by a process comprising:

(1) subjecting a silane composition to hydrolysis and polycondensation, wherein said silane composition comprises: 35 to 100 mole percent of at least one silane compound of general formula (I)

$$R'_m(H)_kSiX_{4-(m+k)} \quad (I)$$

wherein X is a hydrolyzable and polycondensable group, R' is a non-reactive group, the subscript k is 1 or 2, the subscript m is 0 or 1 and (m+k) is 1 or 2; and 65 to 0 mole percent of at least one silane compound of general formula (II)

$$R'_nSiX_{4-n} \quad (II)$$

wherein X and R' are as defined above and the subscript n is 0, 1 or 2; wherein the at least one silane compound of general formula (I) and the at least one silane compound of general formula (II) account for 100 mole percent of silane compounds of the silane composition; and (2) subjecting the resultant product to a hydrosilylation reaction with a hydrosilylation agent having a resin-setting functional group.

21. The thermosetting resin composition of claim 20, which, after having been set, has at least one of (a) an elongation of 1.0% or more as determined by a tensile test; (b) a breaking stress of 2 MPa or more; and (c) a peel strength of at least 0.5 kN/m with an electroconductive layer to which it is bonded.

22. The thermosetting resin composition of claim 20, which comprises the inorganic filler in a weight ratio of 800 or more parts per 100 parts of the thermo setting resin.

23. A resin film, wherein the resin film comprises the thermosetting resin composition of claim 20.

24. A metallic foil provided with an insulation material, wherein the metallic foil comprises on one side thereof a layer comprising the thermosetting resin composition of claim 20.

25. An assembly comprising an insulating film provided with a metallic foil on each side thereof wherein the assembly comprises two sheets of the metallic foil of claim 24 placed on each other in such a way that the layers comprising the thermosetting resin composition are in contact with each other.

26. An insulating film provided with a metallic foil on each side thereof, wherein the insulating film comprises a layer comprising the thermosetting resin composition of claim 20 and wherein the metallic foil comprises a copper foil.

27. A metal-clad laminate comprising a core material coated with an insulating resin layer on at least one side thereof, wherein the insulating resin layer comprises the thermosetting resin composition of claim 20 and is coated with a metallic layer.

28. A multi-layer metal-clad laminate wherein a resin layer is provided on a circuit of an internal circuit board, and wherein the resin layer comprises the thermosetting resin composition of claim 20 and is coated with a metallic layer.

29. A multi-layer printed wiring board, wherein the wiring board has a resin layer on a circuit of an internal circuit board and wherein the resin layer comprises the thermosetting resin composition of claim 20 and is provided with a circuit pattern.

30. A thermosetting resin composition comprising, as essential components: a thermosetting resin having a resin-setting functional group; a setting agent in a ratio of 0.2 to 1.5 equivalents per equivalent of the resin-setting functional group in the thermosetting resin; an inorganic filler, wherein the content F of the inorganic filler in parts per weight per 100 parts per weight of the thermosetting resin and the elongation X in %, determined by a tensile test, of the composition after having been set satisfy the relationship $F \times X > 800$; and an amine compound having two or more reactive functional groups per molecule;

wherein the thermosetting resin is a thermosetting silicone polymer prepared by a process comprising:

(1) subjecting a silane composition to hydrolysis and polycondensation, wherein said silane composition comprises: 35 to 100 mole percent of at least one silane compound of general formula (I)

$$R'_m(H)_kSiX_{4-(m+k)} \quad (I)$$

wherein X is a hydrolyzable and polycondensable group, R' is a non-reactive group, the subscript k is 1 or 2, the subscript m is 0 or 1 and (m+k) is 1 or 2; and 65 to 0 mole percent of at least one silane compound of general formula (II)

$$R'_nSiX_{4-n} \quad (II)$$

wherein X and R' are as defined above and the subscript n is 0, 1 or 2; wherein the at least one silane compound of general formula (I) and the at least one silane compound of general formula (II) account for 100 mole percent of silane compounds of the silane composition; and (2) subjecting the resultant product to a hydrosilylation reaction with a hydrosilylation agent having a resin-setting functional group.

31. The thermosetting resin composition of claim 30, which, after having been set, has at least one of (a) a thermal expansion coefficient of $50 \times 10^{-6}/°$ C. or less, and (b) an elongation X of 1.0 or more.

32. The thermosetting resin composition of claim 30, which comprises the inorganic filler in a weight ratio of 100 to 2,000 parts per 100 parts of the thermosetting resin.

33. A resin film, wherein the resin film comprises the thermosetting resin composition of claim 30.

34. A metallic foil provided with an insulation material, wherein the metallic foil comprises on one side thereof a layer comprising the thermo setting resin composition of claim 30.

35. An assembly comprising an insulating film provided with a metallic foil on each side thereof, wherein the assembly comprises two sheets of the metallic foil of claim 34 placed on each other in such a way that the layers comprising the thermosetting resin composition are in contact with each other.

36. An insulating film provided with a metallic foil on each side thereof, wherein the insulating film comprises a layer comprising the thennosetting resin composition of claim 30 and wherein the metallic foil comprises a copper foil.

37. A metal-clad laminate comprising a core material coated with an insulating resin layer on at least one side thereof, wherein the insulating resin layer comprises the thermosetting resin composition of claim 30 and is coated with a metallic layer.

38. A multi-layer metal-clad laminate wherein a resin layer is provided on a circuit of an internal circuit board, and wherein the resin layer comprises the thermosetting resin composition of claim 30 and is coated with a metallic layer.

39. A multi-layer printed wiring board, wherein the wiring board has a resin layer on a circuit of an internal circuit board and wherein the resin layer comprises the thermoseffing resin composition of claim 30 and is provided with a circuit pattern.

40. A resin film, wherein the resin film comprises a thermosetting resin composition comprising: a thermosetting resin having a resin-setting functional group; a setting agent in a ratio of 0.2 to 1.5 equivalents per equivalent of the resin-setting functional group in the thermosetting resin; an inorganic filler, wherein the inorganic filler is incorporated at 100 to 2,000 parts per weight with respect to 100 parts by weight of the thermosetting resin; and an amine compound having two or more reactive functional groups per molecule;

wherein the thermosetting resin is a thermosetting silicone polymer prepared by a process comprising:

(1) subjecting a silane composition to hydrolysis and polycondensation, wherein said silane composition comprises: 35 to 100 mole percent of at least one silane compound of general formula (I)

$$R'_m(H)_kSiX_{4-(m+k)} \quad \text{(I)}$$

wherein X is a hydrolyzable and polycondensable group, R' is a non-reactive group, the subscript k is 1 or 2, the subscript m is 0 or 1 and (m+k) is 1 or 2; and 65 to 0 mole percent of at least one silane compound of general formula (II)

$$R'_nSiX_{4-n} \quad \text{(II)}$$

wherein X and R' are as defined above and the subscript n is 0, 1 or 2; wherein the at least one silane compound of general formula (I) and the at least one silane compound of general formula (II) account for 100 mole percent of silane compounds of the silane composition; and (2) subjecting the resultant product to a hydrosilylation reaction with a hydrosilylation agent having a resin-setting functional group.

* * * * *

UNITED STATES PATENT AND TRADEMARK OFFICE

CERTIFICATE OF CORRECTION

PATENT NO. : 7,736,749 B2
APPLICATION NO. : 11/537122
DATED : June 15, 2010
INVENTOR(S) : Baba et al.

It is certified that error appears in the above-identified patent and that said Letters Patent is hereby corrected as shown below:

At Column 49, Line 18 (Claim 18, Line 3) of the printed patent, "thermo setting" should be --thermosetting--.

At Column 51, Line 3 (Claim 34, Line 3) of the printed patent, "thermo setting" should be --thermosetting--.

At Column 51, Line 12 (Claim 36, Line 3) of the printed patent, "thennosetting" should be --thermosetting--.

At Column 51, Line 25 (Claim 39, Line 3) of the printed patent, "thermoseffing" should be --thermosetting--.

Signed and Sealed this
Eighteenth Day of January, 2011

David J. Kappos
*Director of the United States Patent and Trademark Office*